(12) United States Patent
Shao

(10) Patent No.: US 11,047,710 B2
(45) Date of Patent: Jun. 29, 2021

(54) INDUCTIVE POSITION SENSOR ASSEMBLY

(71) Applicant: KSR IP Holdings, LLC, Wilmington, DE (US)

(72) Inventor: Lingmin Shao, London (CA)

(73) Assignee: KSR IP Holdings, LLC, Wilmington, DE (US)

( * ) Notice: Subject to any disclaimer, the term of this patent is extended or adjusted under 35 U.S.C. 154(b) by 110 days.

(21) Appl. No.: 16/420,812

(22) Filed: May 23, 2019

(65) Prior Publication Data

US 2019/0360839 A1 Nov. 28, 2019

Related U.S. Application Data

(60) Provisional application No. 62/675,351, filed on May 23, 2018.

(51) Int. Cl.
*G01D 5/20* (2006.01)
*H05K 1/02* (2006.01)
*H03K 17/95* (2006.01)

(52) U.S. Cl.
CPC .......... *G01D 5/2006* (2013.01); *H03K 17/952* (2013.01); *H05K 1/0298* (2013.01)

(58) Field of Classification Search
CPC .... G01D 5/2006; G01D 5/204; H03K 17/952; H03K 17/97; H05K 1/0298; H05K 1/165
USPC ..................................................... 324/207.16
See application file for complete search history.

(56) References Cited

U.S. PATENT DOCUMENTS 5,323,109 A * 6/1994 Mehnert ............. G01D 5/2046
324/207.17
5,404,101 A * 4/1995 Logue ................... B82Y 15/00
310/168
6,255,810 B1 * 7/2001 Irle .......................... G01B 7/30
324/207.17
7,191,759 B2   3/2007 Lee
7,276,897 B2  10/2007 Lee
7,538,544 B2   5/2009 Lee
7,906,960 B2   3/2011 Lee
7,911,354 B2   3/2011 Kim
8,098,061 B2   1/2012 Elliott et al.
8,508,242 B2   8/2013 Shao et al.
(Continued)

FOREIGN PATENT DOCUMENTS

EP   1078226 B1   10/2003

OTHER PUBLICATIONS

International Search Report dated Sep. 9, 2019, International Application PCT/US2019/033722, Filing Date: May 23, 2019.

*Primary Examiner* — Christopher P McAndrew
(74) *Attorney, Agent, or Firm* — Dinsmore & Shohl LLP

(57) ABSTRACT

In accordance with one embodiment of the present disclosure, an inductive sensor assembly includes a shaft and a multilayered printed circuit board (PCB). The shaft includes a first end. The first end has a bottom surface. A target including a flat forming a straight edge is integrally formed into the first end of the shaft. The PCB includes a transmitter coil and a two part receiving coil. The two part receiving coil has a first receiving coil and a second receiving coil. The first receiving coil is on a different layer of the PCB than the second receiving coil in an axial direction. The target is rotated about a central axis of the two part receiving coil. The straight edge of the target and the bottom surface is detected by the two part receiving coil.

20 Claims, 25 Drawing Sheets

(56) References Cited

U.S. PATENT DOCUMENTS

| | | | |
|---|---|---|---|
| 9,983,045 B2 | 5/2018 | O'Neill | |
| 10,278,288 B2 | 4/2019 | Elliott et al. | |
| 10,320,499 B2 | 6/2019 | Lomnitz | |
| 2003/0020642 A1 | 1/2003 | Ely et al. | |
| 2005/0225320 A1 | 10/2005 | Lee | |
| 2005/0253576 A1* | 11/2005 | Nyce | G01D 5/2216 324/207.17 |
| 2006/0001518 A1* | 1/2006 | Hayashi | G01D 5/2046 336/200 |
| 2007/0145830 A1* | 6/2007 | Lee | H02J 7/0029 307/135 |
| 2007/0194781 A1* | 8/2007 | Zhitomirskiy | G01D 5/204 324/207.17 |
| 2010/0123302 A1* | 5/2010 | Bujak | B60R 21/01554 280/735 |
| 2011/0187358 A1* | 8/2011 | Eutebach | G01D 5/24461 324/207.25 |
| 2013/0127449 A1* | 5/2013 | Backes | G01B 7/003 324/207.18 |
| 2014/0035564 A1* | 2/2014 | Lee | G01D 5/204 324/207.12 |
| 2016/0109279 A1* | 4/2016 | O'Neill | G01F 23/38 73/313 |
| 2016/0131503 A1 | 5/2016 | Goto et al. | |
| 2018/0224301 A1* | 8/2018 | Herrmann | G01D 5/2258 |
| 2018/0372513 A1* | 12/2018 | Cai | G01L 3/105 |
| 2019/0128703 A1* | 5/2019 | Elliott | H03K 5/1565 |

\* cited by examiner

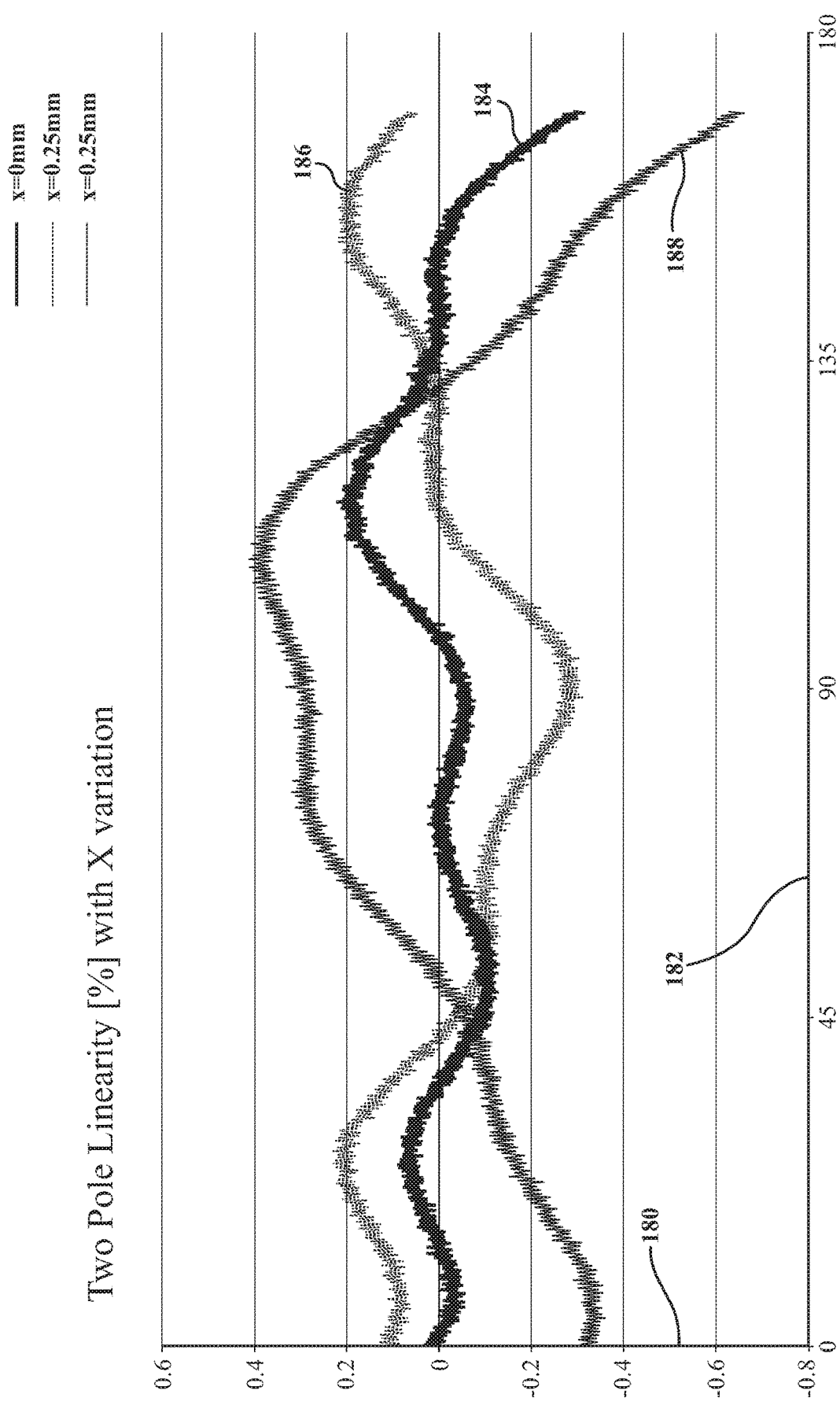

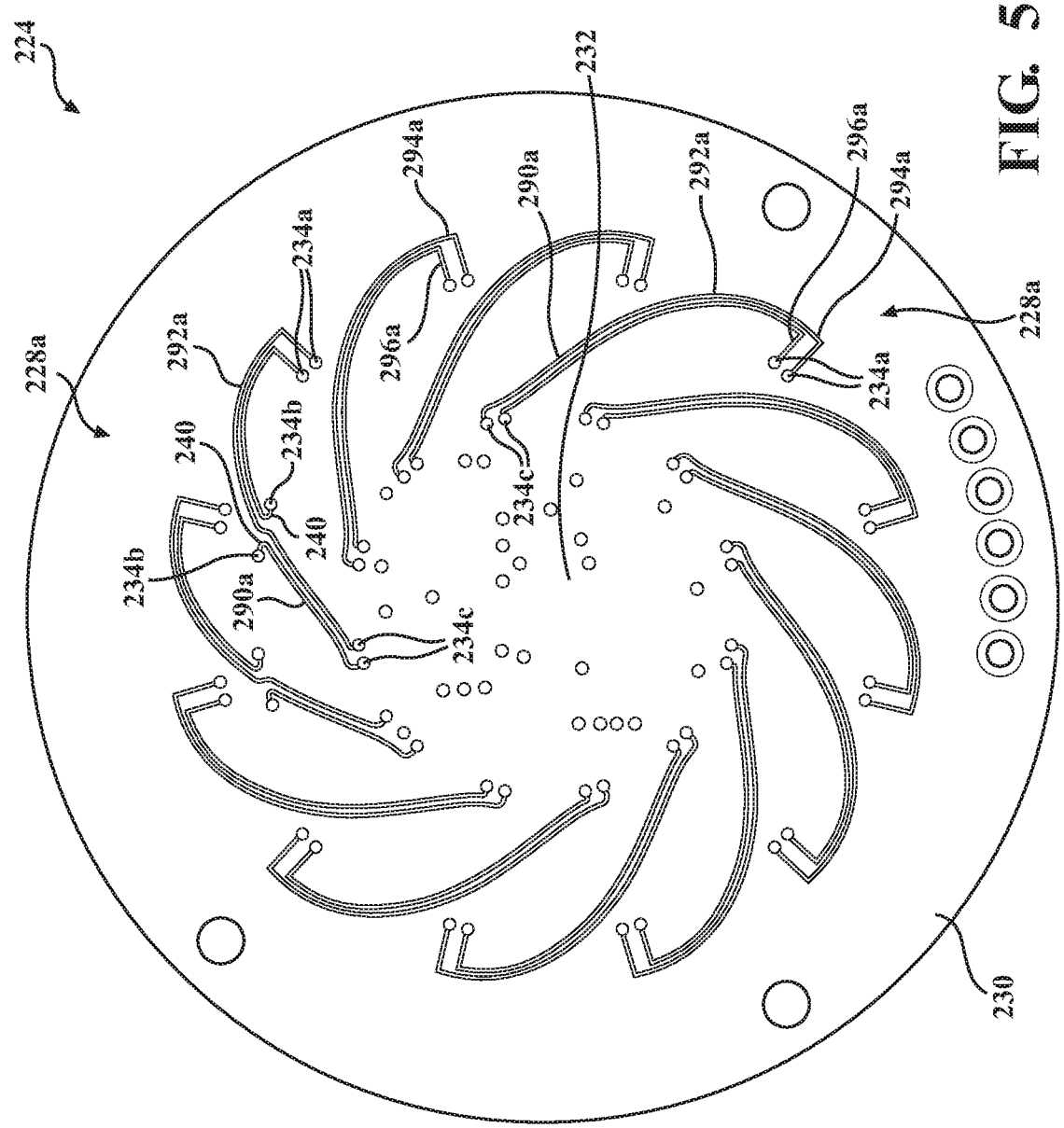

INDUCTIVE POSITION SENSOR ASSEMBLY

CROSS REFERENCE TO RELATED APPLICATIONS

This Application claims priority of U.S. Provisional Application Ser. No. 62/675,351 filed on May 23, 2018, the content of which is incorporated herein in its entirety.

TECHNICAL FIELD

This invention relates to inductive angular position sensor assemblies, and in particular, to a coil arrangement and an end-of-shaft coupler element.

BACKGROUND

It is known to provide, in automotive applications, inductive angular position sensors printed on a printed circuit board ("PCB"). An inductive position sensor includes a transmitter coil powered by an alternating current source to produce an electromagnetic carrier flux. A receiver coil receives the carrier flux, and generates a receiver signal. The receiver signal varies with the position of a coupler element (such as a rotor) supported parallel to and closely adjacent to the transmitter coil and receiver coil. The coupler element moves with the part whose position is to be measured. As such, the coupler element is an additional piece of material that functions as a target for the receiver coils.

The addition of the coupler element, as an additional piece of material, increases the material needed for the position sensor as well as the production costs. As such, there is a need for an inductive angular position sensor without the added coupler element.

SUMMARY

In one embodiment, an inductive sensor assembly includes a shaft and a multilayered printed circuit board (PCB). The shaft includes a first end. The first end has a bottom surface. A target including a flat forming a straight edge is integrally formed into the first end of the shaft. The PCB includes a transmitter coil and a two part receiving coil. The two part receiving coil has a first receiving coil and a second receiving coil. The first receiving coil is on a different layer of the PCB than the second receiving coil in an axial direction. The target is moved about a central axis of the two part receiving coil. The straight edge of the target and the bottom surface is detected by the two part receiving coil.

In another embodiment, an inductive sensor assembly includes a shaft and a multilayered printed circuit board (PCB). The shaft includes a first end. The first end has a bottom surface. A target having a flat forming a straight edge is integrally formed into the first end of the shaft. The PCB includes at least four layers and includes a two part transmitter coil and a two part receiving coil. The two part transmitter coil has an upper coil and a lower coil. The two part receiving coil has a first receiving coil and a second receiving coil. The upper coil is positioned on a first layer of the PCB and the lower coil is positioned on a second layer of the PCB. The first receiving coil is positioned on a third layer of the PCB and the second receiving coil is positioned on a fourth layer of the PCB in an axial direction. The target is moved about a central axis of the two part receiving coil. The straight edge of the target and the bottom surface is detected by the two part receiving coil.

In yet another embodiment, a method of determining a position of a movable shaft is provided. The method includes milling an end of a shaft to form a target. The target has a first planar surface forming a straight edge and an undercut portion forming a second planar surface. The second planar surface is spaced apart from the first planar surface a predetermined distance such that the first planar surface is a coupler. The method further includes moving the target about a shaft axis, exciting a transmitter coil, obtaining a plurality of receiver signals from a sensor assembly, determining the target position based on the straight edge and the first planar surface, and transmitting a corrected sinusoidal input signal to a signal processor.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and example in nature and not intended to limit the subject matter defined by the claims. The following detailed description of the illustrative embodiments can be understood when read in conjunction with the following drawings, wherein like structure is indicated with like reference numerals and in which:

FIG. 4B schematically depicts a graph of the one-pole linearity percentages with a Z-variation according to one or more embodiments shown and described herein;

FIG. 5C schematically depicts an isolated top view of a first receiving coil of the sensor assembly of FIG. 5A according to one or more embodiments shown and described herein;

DETAILED DESCRIPTION

The present disclosure relates generally to an inductive sensor system having a transmitter coil and a two-part receiving coil within a multilayer printed circuit board (PCB) and a coupler target integral with a shaft such that when the shaft rotates, the transmitter coil and the two-part receiving coil determine the position of the coupler. The coupler is formed from machining or removing material from the shaft to create geometric shapes, such as at least one flat having at least one straight edge. For instance, a one-pole coupler has one flat creating a single straight edge, a two pole coupler has two machined flats creating two straight edges, a three pole coupler has three machined flats creating three straight edges, a four pole coupler has four machined flats creating four straight edges, and the like.

The transmitter coil includes two parts interlaced between two layers of the PCB. Each part of the transmitter coil is generally circular and extends at least the diameter of the target coupler. The two-part receiving coil includes a first receiving coil and a second receiving coil. The first receiving coil and the second receiving coil are interlaced between two separate layers of the PCB. The arrangement of the first receiving coil and the second receiving coil in a one-pole application is semi-circular. The arrangement of the first receiving coil and the second receiving coil in two-pole, three-pole and four-pole applications is a plurality of hooks extending radially outward from a central axis of the two part receiving coil. Each hook of the plurality of hooks has a shank portion, a throat portion, a bend portion and a point portion. The shank portion extends radially from the central axis of the two part receiving coil. The throat portion being adjacent to the transmitter coil and in the two pole and three pole applications, the point portion extending radially from the transmitter coil towards the central axis of the two part receiving coil. In the four pole application, the plurality of hooks extending radially outward from a central axis are inverted so to extend beyond the transmitter coil. The first receiving coil and the second receiving coil are arranged in each of the applications such that a sinusoidal wave is created when sensing the geometries of the coupler target at the end of the shaft and such that harmonics associated with sensing the geometries of the coupler target are reduced and/or eliminated.

Although embodiments herein are described in the context of an angular rotating inductive sensor assembly, embodiments are not limited thereto. For example, the inductive sensor assembly systems described herein may be used for various position sensing applications such as linear, elliptical, and the like. Other uses should generally be understood and are included within the scope of the present disclosure.

Figure 1A:
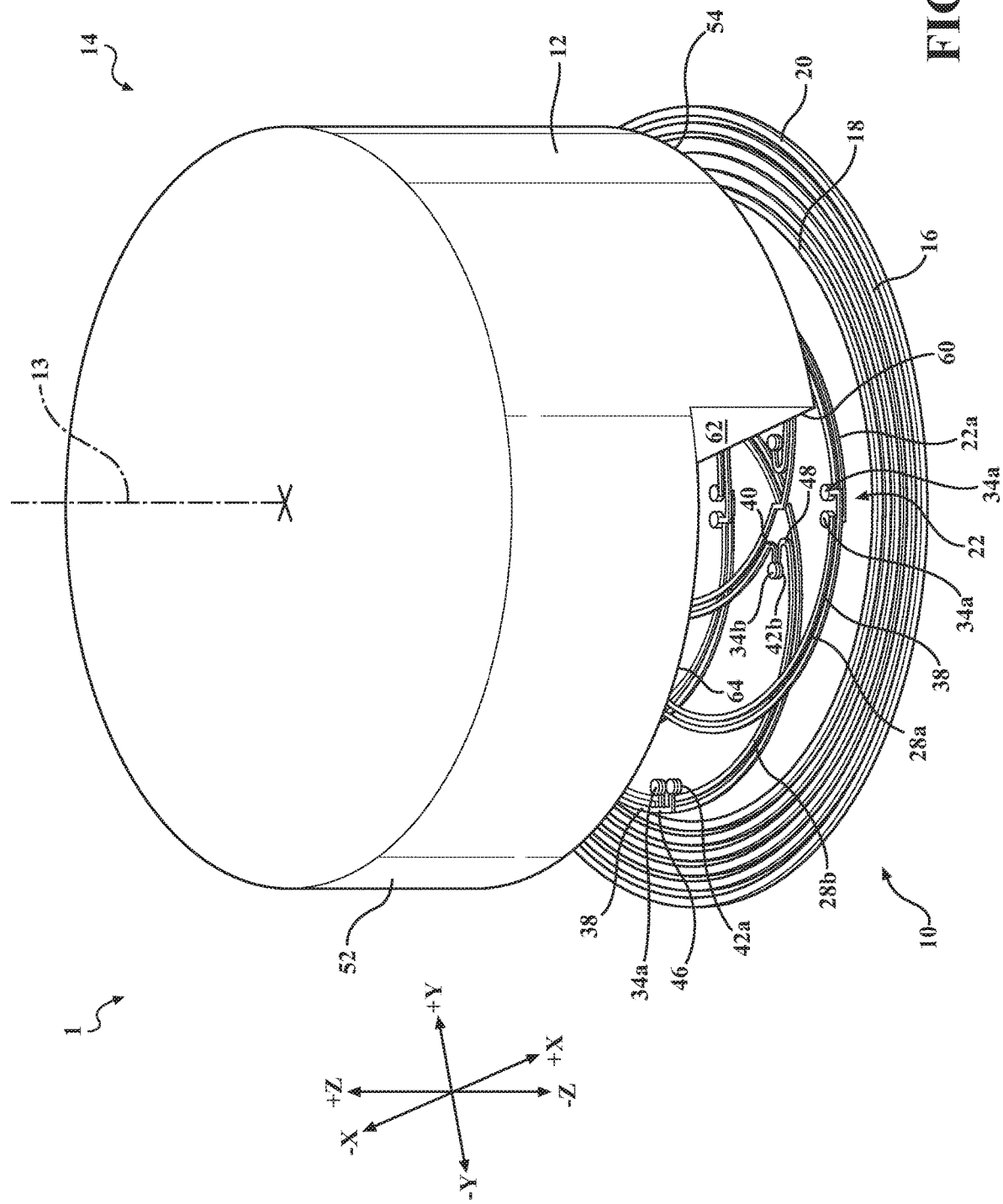
FIG. 1A schematically depicts a perspective view of a one pole sensor assembly according to one or more embodiments shown and described herein.

As used herein, the term "longitudinal direction" refers to the forward-rearward direction of the system (i.e., in the +/−X direction depicted in FIG. 1A). The term "lateral direction" refers to the cross-direction (i.e., in the +/−Y direction depicted in FIG. 1A), and is transverse to the longitudinal direction. The term "vertical direction" refers to the upward-downward direction of the system (i.e., in the +/−Z-direction depicted in FIG. 1A). As used herein, "upper", "above" or "top" is defined as the positive Z direction of the coordinate axis shown in the drawings. "Lower", "below" or "bottom" is defined as the negative Z direction of the coordinate axis shown in the drawings. Further, the terms "inboard", "outboard", "inward", and "outward" are used to describe the relative positioning of various components of the system and/or their movements.

It should be appreciated that like elements of the different embodiments are denoted by like reference numbers increased by 100.

Turning to the drawings, FIGS. 1A-1G schematically depict a one pole sensor assembly 1. The one pole sensor assembly 1 includes a sensor assembly 10 and a first end 12 of a shaft 14. It should be appreciated that only a portion of the shaft 14 is illustrated and that the shaft may be any width, diameter, radius, and/or the like. The sensor assembly 10 includes a transmitter coil 16. The transmitter coil 16 is generally circular in shape and has a predetermined inner diameter 18 and a predetermined outer diameter 20. The transmitter coil 16 may be powered by an alternating current source (not shown) to produce an electromagnetic carrier flux.

The sensor assembly 10 further includes a two-part receiving coil 22. The two-part receiving coil 22 includes a first receiving coil 24, a second receiving coil 26 and a center region 32. The center region 32 further includes a central axis 68. The first receiving coil 24 may include a plurality of c-shaped coils or crescent shaped coils 28a and the second receiving coil 26 may include a plurality of c-shaped coils or crescent shaped coils 28b. In some embodiments, each of the plurality of crescent shaped coils 28a and each of the plurality of crescent shaped coils 28b are a pair of coils, traces, and the like. In other embodiments, each of the plurality of crescent shaped coils 28a and each of the plurality of crescent shaped coils 28b are singular or have more than two coils, traces, and the like. The plurality of crescent shaped coils 28a of the first receiving coil 24 are on a different layer of a printed circuit board (PCB) 30 than the plurality of crescent shaped coils 28b of the second receiving coil 26 in an axial direction or vertical direction (i.e., in the +/−Z-direction), as described in further detail herein. In some embodiments, the crescent shaped coils 28a and the crescent shaped coils 28b are a constant radius. In other embodiments, the crescent shaped coils 28a and the crescent shaped coils 28b are mostly a constant radius. In yet other embodiments, the crescent shaped coils 28a and the crescent shaped coils 28b have constant radius portions.

The plurality of crescent shaped coils 28a of the first receiving coil 24 extend at least partially radially outwardly from the center region 32 and, in embodiments, extend about the central axis 68. Connection junctions 34a may be disposed at each first end 36 and/or at a second end 38 of the plurality of crescent shaped coils 28a of the first receiving coil 24. In some embodiments, each of the connection junctions 34a of the first end 36 may be L-shaped such that the connection junctions define a circumference of the center region. It should be appreciated that the number of connection junctions 34a may depend on the number of coils, and, as such, embodiments described herein are non-limiting examples thereof.

In some embodiments, each of the connection junctions 34a of the second end 38 may be L-shaped such that the connection junctions define an outer region. The circumference of the outer region may be adjacent to the inner diameter 18 of the transmitter coil 16. In embodiments, each of the connection junctions 34a of the first end 36 and second end 38 may be arranged such that the connection junctions 34a may be positioned towards the center region 32. In some embodiments, the plurality of crescent shaped coils 28a of the first receiving coil 24 further include additional or supplemental connection junctions 34b between the first end 36 and the second end 38. In some embodiments, the additional or supplemental connection junctions 34b may be along a radius of at least one of the plurality of crescent shaped coils 28a. The connection junctions 34b may be disposed at a point of a curved portion 40. The curved portion 40 may hook or bend towards and/or away from the center region 32. In embodiments, the plurality of crescent shaped coils 28a of the first receiving coil 24 are symmetric in shape. In other embodiments, the plurality of crescent shaped coils 28a of the first receiving coil 24 are not symmetric.

The plurality of crescent shaped coils 28b of the second receiving coil 26 extend at least partially radially outwardly from the center region 32 and, in some embodiments, about the central axis 68. Connection junctions 40a may be disposed at each first end 44 and connection junctions 42a at a second end 46 of the plurality of crescent shaped coils 28b of the second receiving coil 26. In some embodiments, each of the connection junctions 40a of the first end 44 may be L-shaped. It should be appreciated that the number of connection junctions 40a may depend on the number of coils, and, as such, embodiments described herein are non-limiting examples thereof.

It should be appreciated that the connection junctions 34a disposed at each first end 36 of the plurality of crescent shaped coils 28a of the first receiving coil 24 and connection junctions 40a disposed at each first end 44 plurality of crescent shaped coils 28b of the second receiving coil 26 align in an axial direction or in the vertical direction (i.e., in the +/−Z-direction) so to communicatively couple to one another. In embodiments, the coupling of the connection junctions 34a and the connection junctions 40a define a circumference of the center region 32.

In some embodiments, each of the connection junctions 42a of the second end 46 may be L-shaped such that the connection junctions define an outer region. The circumference of the outer region may be adjacent to the inner diameter 18 of the transmitter coil 16. In embodiments, each of the connection junctions 40a of the first end 44 and the connection junctions 42s of the second end 46 may be arranged such that the connection junctions 40a are positioned towards the center region 32. In some embodiments, the plurality of crescent shaped coils 28b of the second receiving coil 26 further include additional or supplemental connection junctions 42b between the first end 44 and the second end 46. In some embodiments, the additional or supplemental connection junctions 42b may be along a radius of at least one of the plurality of crescent shaped coils 28b. The connection junctions 42b may be disposed at a point of a curved portion 48. The curved portion 48 may bend towards and/or away from the center region 32. In embodiments, the plurality of crescent shaped coils 28b of the second receiving coil 26 are symmetric in shape. In other embodiments, the plurality of crescent shaped coils 28b of the second receiving coil 26 are not symmetric.

Figure 1B:
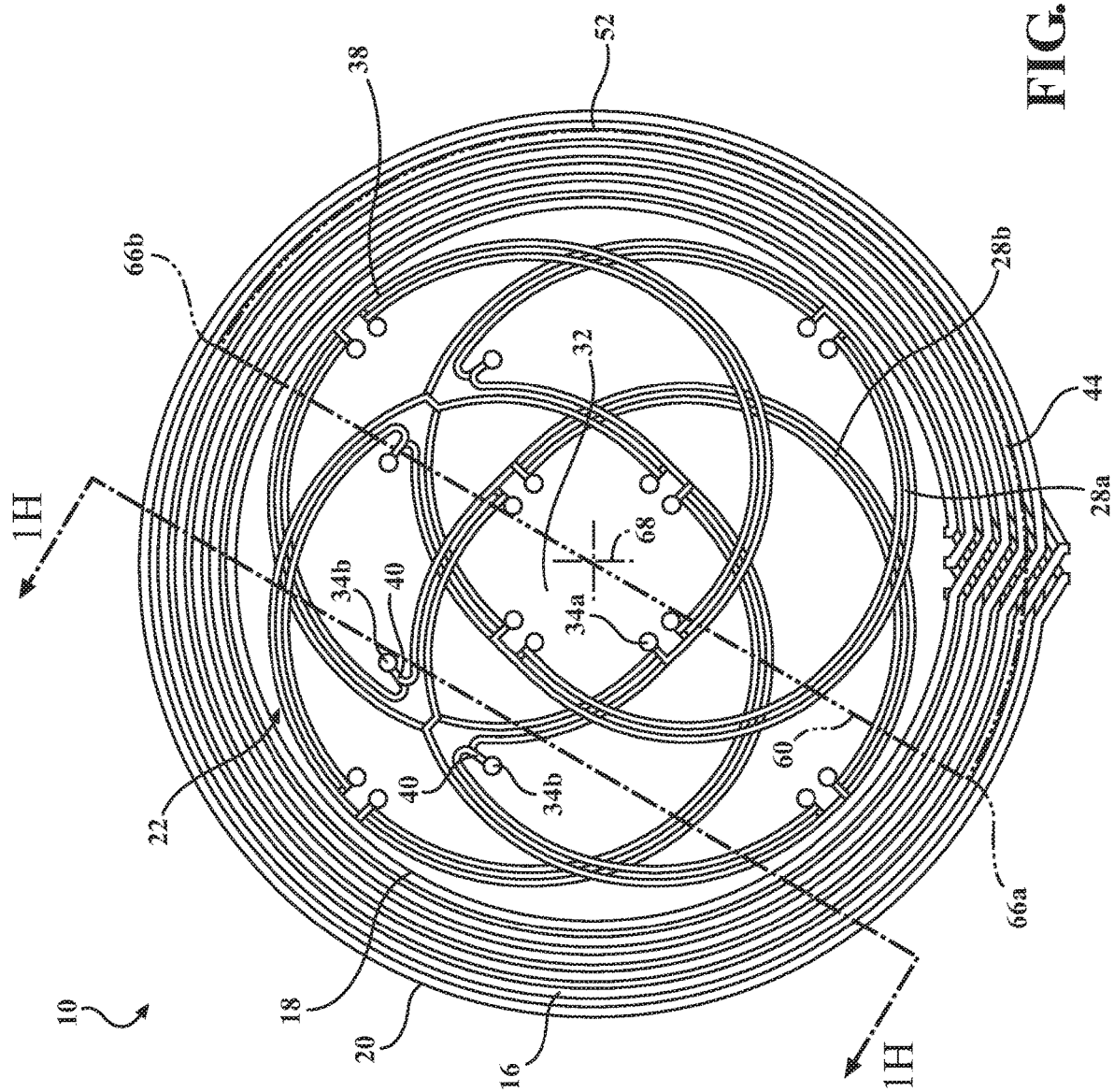
FIG. 1B schematically depicts a top view of the sensor assembly of FIG. 1A highlighting a coupler element in communication with a sensor according to one or more embodiments shown and described herein.
Figure 1C:
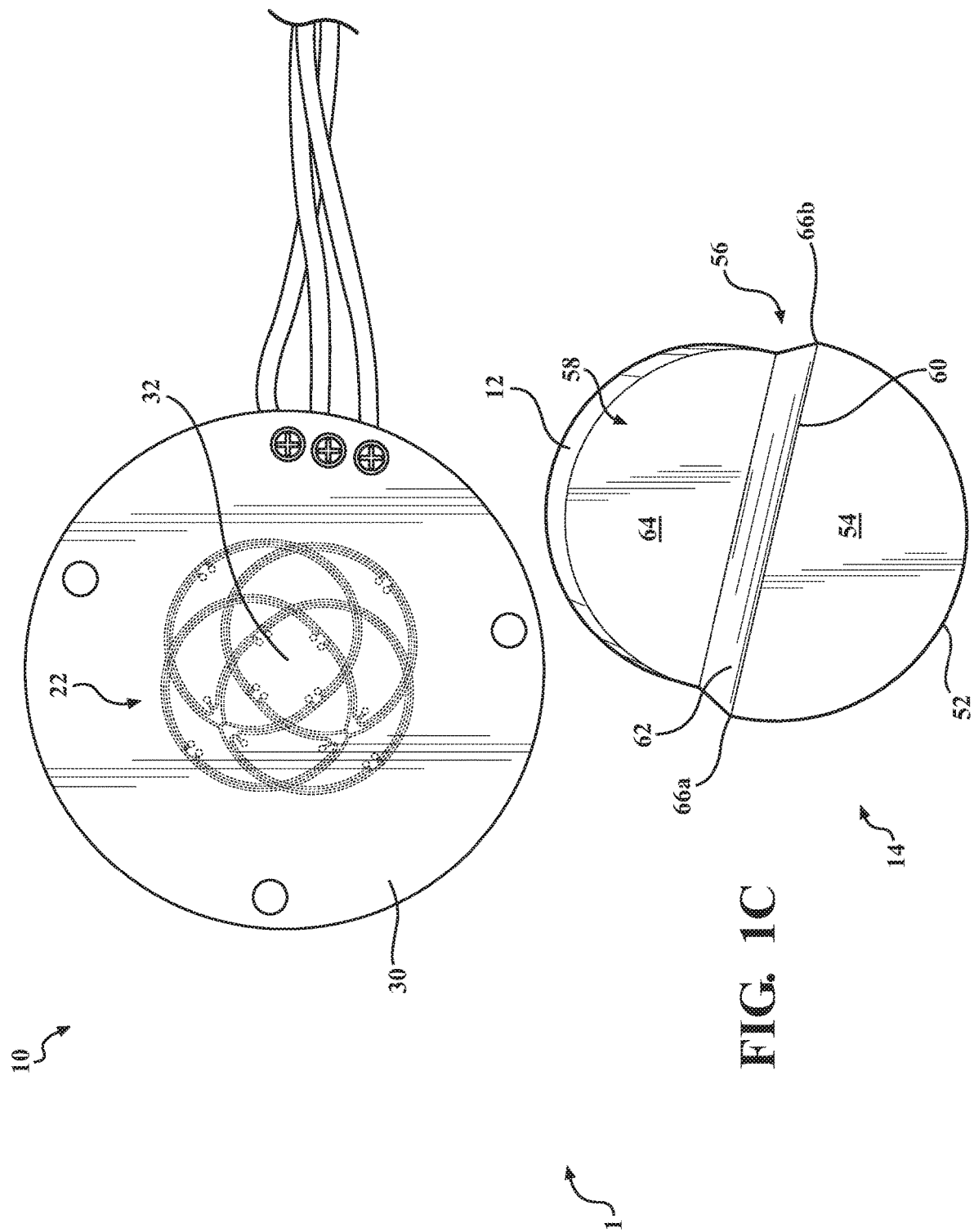
FIG. 1C schematically depicts a top view of the sensor assembly of FIG. 1A including a top view of the sensor and the end-of-shaft according to one or more embodiments shown and described herein.
Figure 1E:
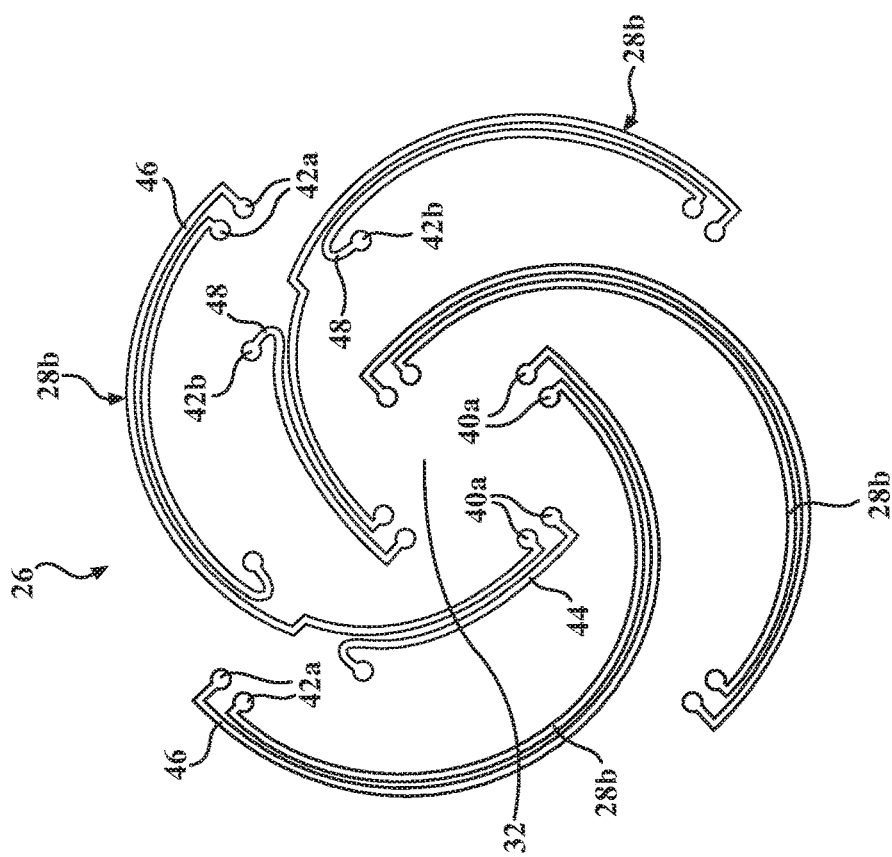
FIG. 1E schematically depicts an isolated top view of a second receiving coil of the sensor assembly of FIG. 1A according to one or more embodiments shown and described herein.
Figure 1D:
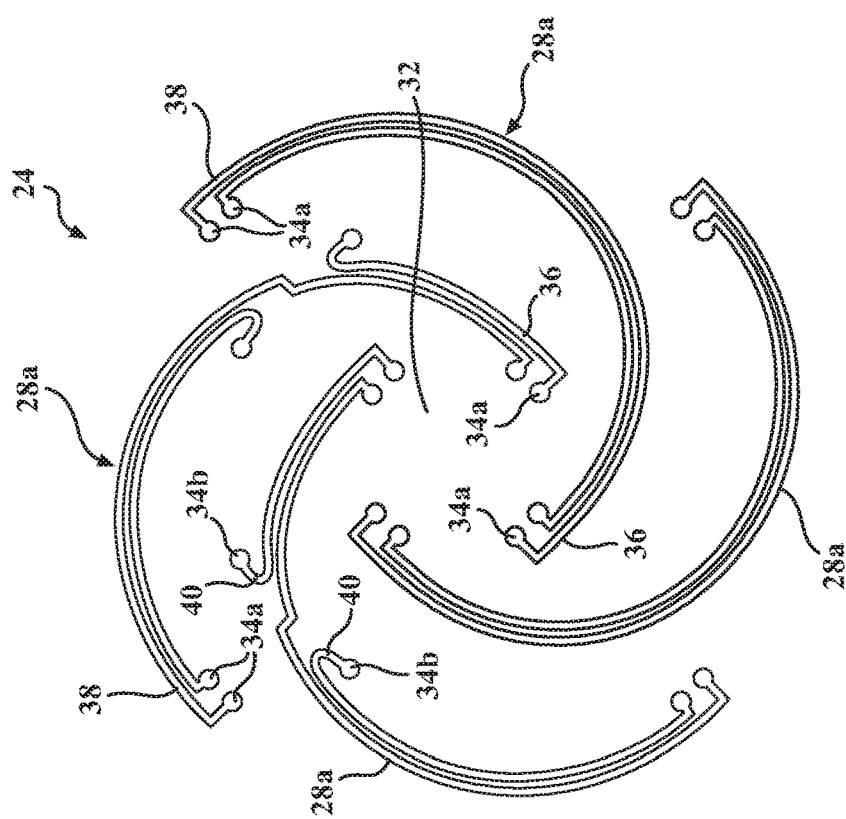
FIG. 1D schematically depicts an isolated top view of a first receiving coil of the sensor assembly of FIG. 1A according to one or more embodiments shown and described herein.

The plurality of crescent shaped coils 28a of the first receiving coil 24 and the plurality of crescent shaped coils 28b of the second receiving coil 26 are oppositely wound and/or offset in opposite directions such that the coils are oppositely facing around the center region 32, as best seen in FIGS. 1D-1E. It is appreciated that the first receiving coil 24 and the second receiving coil 26 may be identically offset using the equation $$\frac{90}{N}$$

degrees where N is equal to the number of poles. In this example, and not by way of limitation, there is one pole so the first receiving coil 24 and the second receiving coil 26 are offset by 90 degrees. As such, the plurality of crescent shaped coils 28a of the first receiving coil 24 and the plurality of crescent shaped coils 28b of the second receiving coil 26 are offset from one another such that the connection junctions 34a, 34b of the first receiving coil 24 align with the connection junctions 42a, 42b of the second receiving coil 26. In some embodiments, the corresponding of the connection junctions 34a, 34b of the first receiving coil 24 to the connection junctions 42a, 42b of the second receiving coil 26 permit communication and/or receiving of flux changes associated with the first end 12 of the shaft 14, as discussed in greater detail herein.

The first receiving coil 24 and the second receiving coil 26 may be positioned in separate layers of the PCB 30 in the axial direction or in the vertical direction (i.e., in the +/−Z-direction) such that a difference in the distance or airgap from the first end 12 of shaft 14 is created. It should be appreciated that the depth of the plurality of crescent shaped coils 28a of first receiving coil 24 and the plurality of crescent shaped coils 28b of the second receiving coil 26 are selected with a relationship to the first end 12 of the shaft 14 based on a strength of the signal required for the airgap or distance. That is, each one of the plurality of crescent shaped coils 28a of first receiving coil 24 is in one layer of the PCB 30 and each one of the plurality of crescent shaped coils 28b of the second receiving coil 26 are in an another or different layer of the PCB 30 from the plurality of crescent shaped coils 28a of first receiving coil 24. In some embodiments, the first receiving coil 24 and the second receiving coil 26 may be positioned in adjacent or adjoining layers. In other embodiments, the first receiving coil 24 and the second receiving coil 26 may be positioned in layers that are spaced apart or separated by another layer that may be unoccupied or may contain other coils (i.e. a portion of the transmitter coil and the like).

Figure 1F:
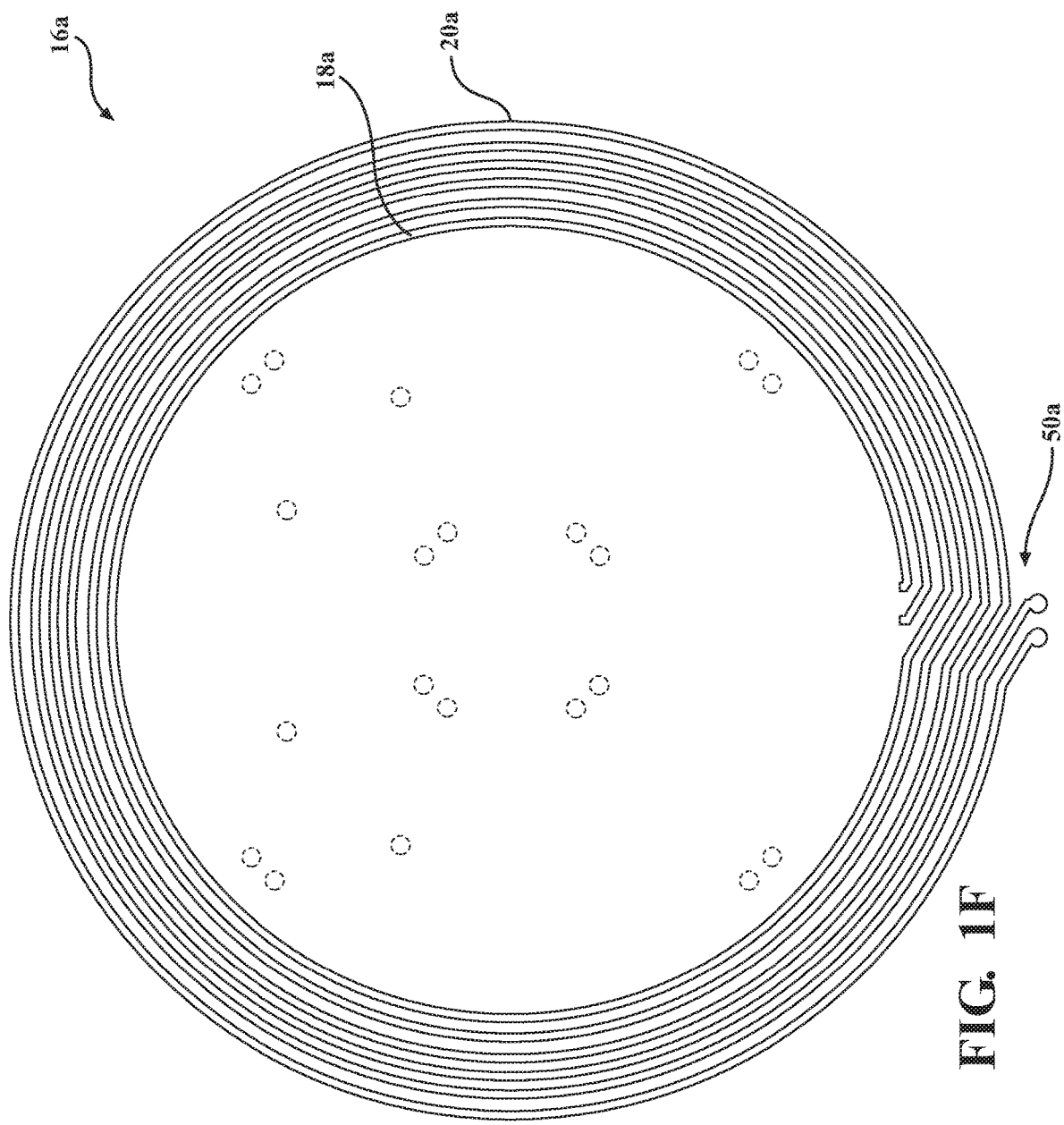
FIG. 1F schematically depicts an isolated top view of a first part transmitter coil of the sensor assembly of FIG. 1A according to one or more embodiments shown and described herein.
Figure 1G:
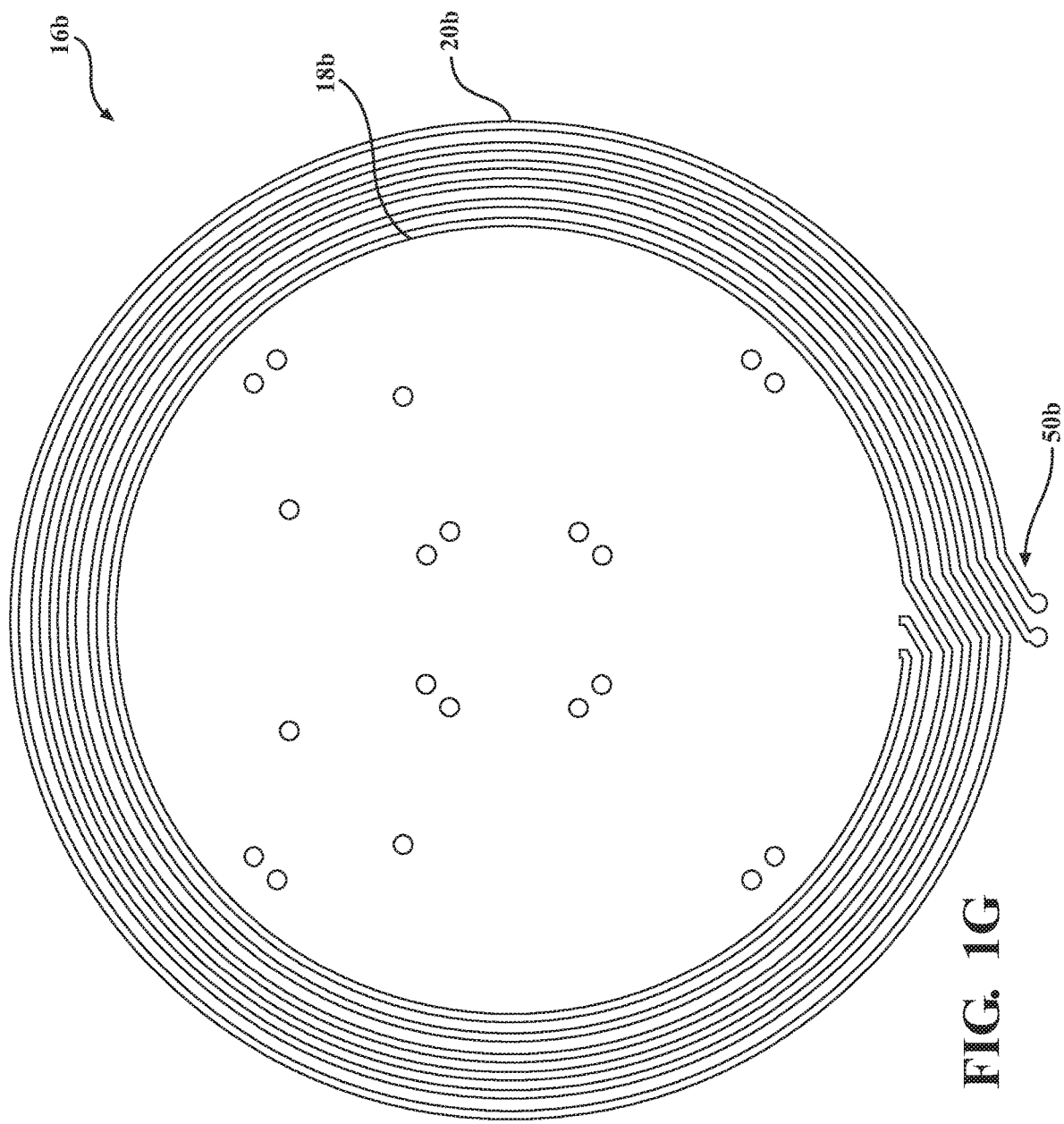
FIG. 1G schematically depicts an isolated top view of a second part transmitter coil of the sensor assembly of FIG. 1A according to one or more embodiments shown and described herein.
Figure 1H:
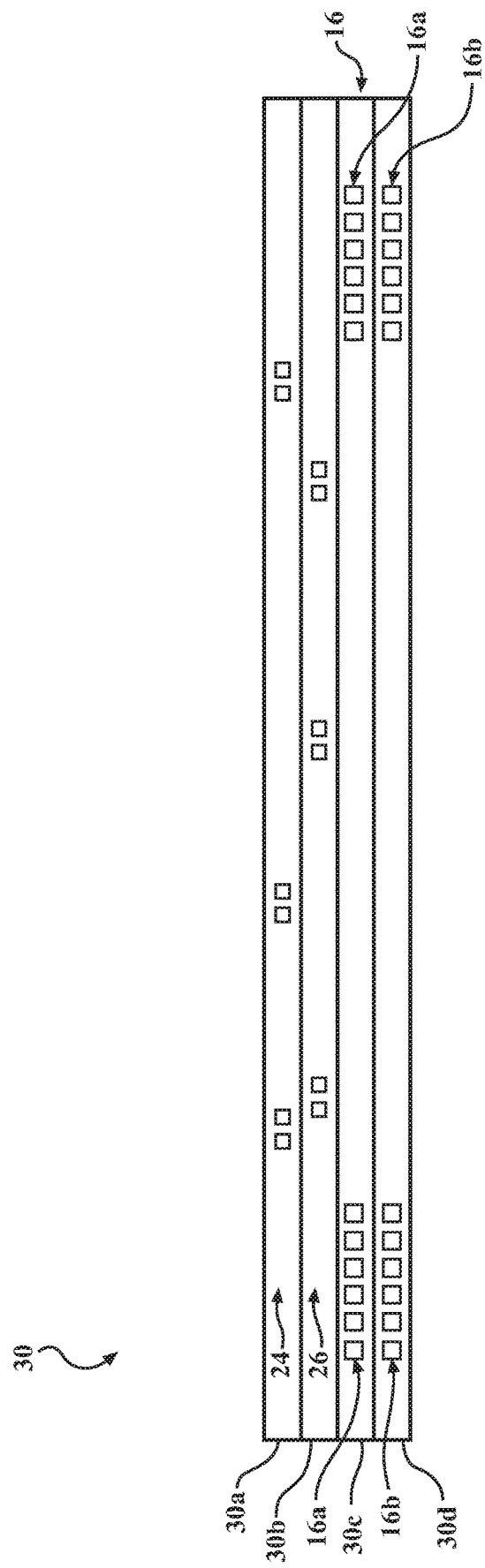
FIG. 1H schematically depicts a cross-sectional view of the sensor assembly of FIG. 1A taken from line 1-1 according to one or more embodiments shown and described herein.

As such, portions of the first receiving coil 24 overlap portions of the second receiving coil 26 and portions of the second receiving coil 26 under lap portions of the first receiving coil 24, as best seen in FIGS. 1A-1C for this embodiment and shown in the cross-sectional view of FIG. 1H. As such, it should be appreciated that the overlap portions are not connected with the path of the coil above and/or below, and that this coil arrangement permits sensing of the first end 12 of the shaft 14 from different distances or air gaps and permits the first receiving coil 24 and the second receiving coil 26 to act as independent coils. In yet other embodiments, portions of the first receiving coil 24 and the second receiving coil 26 are disposed within the same layer of the PCB 30 so to have the same depth in the vertical direction (i.e., in the +/−Z-direction) or airgap from the first end 12 of shaft 14.

It should also be appreciated that the plurality of crescent shaped coils 28a of first receiving coil 24 and the plurality of crescent shaped coils 28b of the second receiving coil 26 are depicted as each having four coils, but this is a non-limiting example and the two-part receiving coil 22 may have more or less. In addition, it should be appreciated that there may be more crescent shaped coils 28a in the first receiving coil 24 than in the second receiving coil 26, and vice versa. Further, it should be appreciated that the plurality of crescent shaped coils 28a of first receiving coil 24 and the plurality of crescent shaped coils 28b of the second receiving coil 26 may be coplanar with the transmitter coil 16 or may be in parallel planes with each other and/or with the transmitter coil 16.

Still referring to FIGS. 1A-1G, and in particular FIGS. 1F-1G, the transmitter coil 16 includes two parts, an upper coil 16a and a lower coil 16b interlaced between two layers of the PCB 30. Each part of the transmitter coil 16 is generally circular and extends at least the diameter of the target coupler, as discussed in greater detail herein. Further, the upper coil 16a has an inner diameter 18a and an outer diameter 20a and the lower coil 16b has an inner diameter 18b and an outer diameter 20b. The inner and outer diameters of the upper and lower coils 16a, 16b form the inner diameter 18 and outer diameter 20 of the transmitter coil 16.

Figure 7:
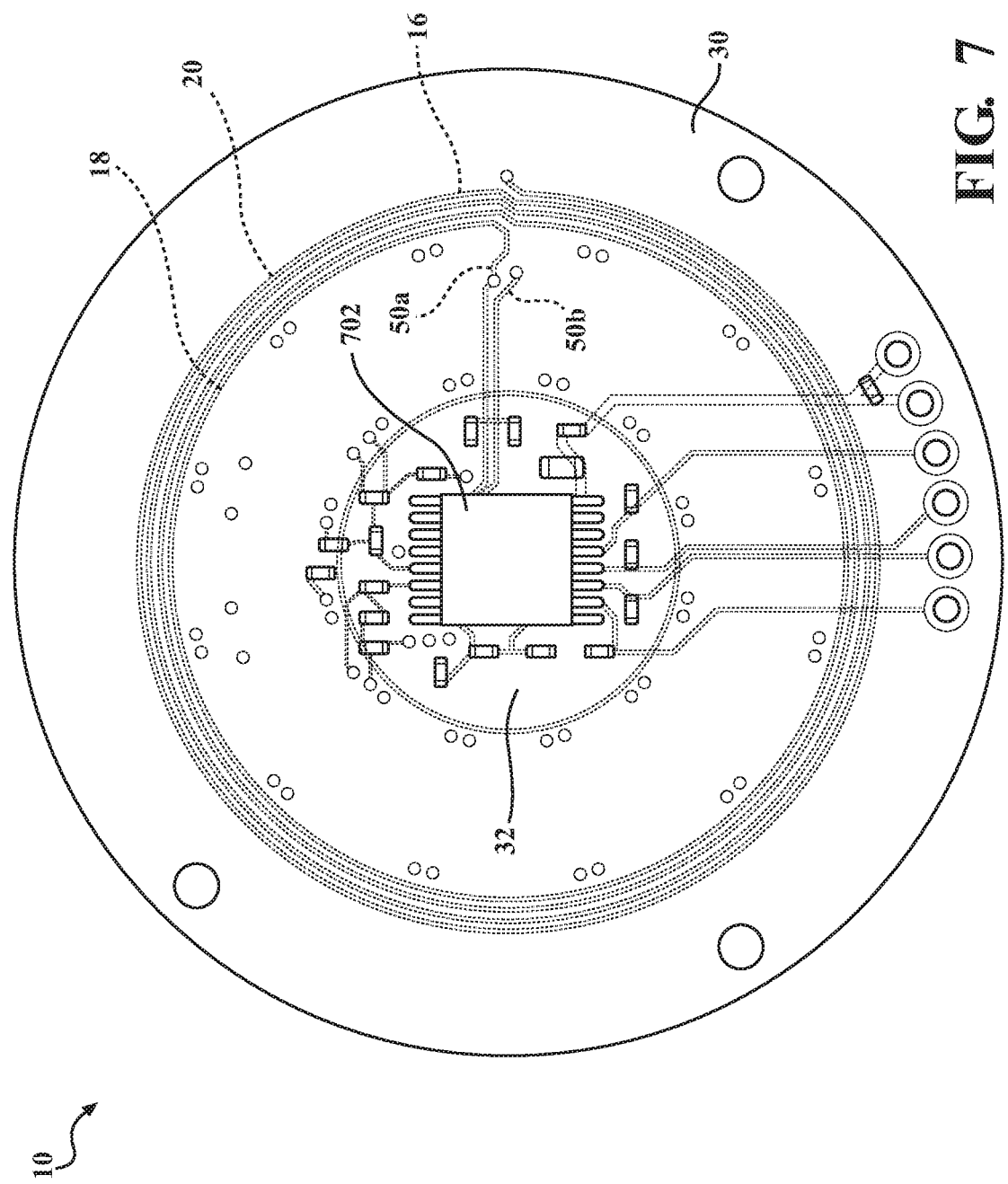
FIG. 7 schematically depicts a signal processor of a sensor assembly according to one or more embodiments shown and described herein.

Still referring to FIGS. 1F-1G and now also to FIG. 7, the upper coil 16a includes at least one leg 50a and the lower coil 16b includes at least one leg 50b. The legs 50a, 50b connect the transmitter coil to a signal processor 702, interconnect the upper coil 16a and the lower coil 16b, and/or the like. It should be appreciated that the position of the legs 50a, 50b may be based on the sensor configuration and placement of the signal processor 702. For example, if the signal processor 702 is disposed within the outer diameter 20 of the transmitter coil 16, the legs 50a, 50b may extend inward towards the inner diameter 18 of the transmitter coil 16. Similarly, if the signal processor 702 is disposed somewhere outside of the outer diameter 20 of the transmitter coil 16, the legs 50a, 50b may extend outwardly away from the outer diameter 20 of the transmitter coil 16.

Now referring back to FIGS. 1A-1G, the upper coil 16a, the lower coil 16b, the first receiving coil 24, and the second receiving coil 26 may be printed on and/or within different layers of the PCB 30, a circuit board, and the like, as discussed in greater detail herein. The PCB 30 may be circular to match the first end 12 of the shaft 14 or may be any shape such as a shape that that fits packaging constraints and/or the like (i.e. square, rectangular, elliptical, and the like). Further, the upper coil 16a, the lower coil 16b, the first receiving coil 24 and the second receiving coil 26 may be layered within different layers of the PCB 30, may have traces connecting the coils, the coils may include traces, and/or the like.

Referring to FIG. 1H, a cross-sectional view of the sensor assembly 10 of FIG. 1 taken from line 1-1 will be described. As discussed above, the first receiving coil 24 may be disposed within a particular layer or set of layers of the PCB 30 while the second receiving coil 26 may be disposed within another particular layer or set of layers of the PCB 30. In addition, the upper coil 16a may be disposed within a particular layer or set of layers while the lower coil 16b may be disposed within another particular layer or set of layers of the PCB 30. For example and not a limitation, the first receiving coil 24 is positioned in a first layer 30a and the second receiving coil 26 are positioned in a second layer 30b such that each occupy separate layers of the PCB 30, as explained above. Further, the upper coil 16a is positioned in a third layer 30c and the lower coil 16b is positioned in a fourth layer 30d such that each occupy separate layers of the PCB 30. As such, it should also be appreciated that each layer of the PCB 30 may have a different coil. Further, it should be appreciated that the two-part receiving coil 22 is above the transmitter coil 16 in the axial or vertical direction (i.e., in the +/−Z-direction). It should also be appreciated that the PCB may have more than four layers and that some layers may be unoccupied by a coil or the like.

Referring back to FIGS. 1A-1G, the first end 12 of the shaft 14 will be described. The shaft 14 may be an elongated member having the first end 12 and an opposite second end (not shown). It should be appreciated that the second end may be attached to a device (not shown) such that the second end 34 rotates or moves (i.e., linearly, curvilinear, elliptically, and the like) with respect to the sensor assembly 10 about the shaft axis 13. The shaft 14 may be any material suitable for influencing, changing, modifying, and the like, the electromagnetic field or the magnetic flux and/or that makes the shaft a coupler such that the coupling may be detected by the sensor assembly 10.

The first end 12 is integrally formed from the shaft 14. That is the first end 12 is the shaft 14, but incorporating geometrical differences as discussed in greater herein. As such, the first end 12 includes a cylindrical outer surface 52 and a bottom surface 54. The bottom surface 54 is planar. The cylindrical outer surface 52 may be milled, machined, and/or the like so to incorporate the geometric differences such as forming a flat portion 56 in the cylindrical outer surface 52, which creates an undercut portion 58. That is, a flat portion may be formed by removing cylindrical outer surface 52 in radially from the shaft axis 13. The undercut portion 58 has a void or is missing shaft material. That is, creating the flat portion 56 in the cylindrical outer surface 52 radially from the shaft axis 13 shaves or removes a portion of the cylindrical outer surface 52 and a portion of the bottom surface 54 such that portions of the cylindrical outer surface 52 and the bottom surface 54 of the first end 12 are removed. The flat portion 56 includes a wall 62 extending coaxially with the shaft axis 13 towards the second end (not shown) and terminates at an upper end at an undercut surface 64. The undercut surface is a second planar surface spaced apart from the bottom surface 54. As best seen in FIG. 1C, a lower end of the wall 62 terminates at the bottom surface 54, which forms a straight edge 60. The straight edge 60 extends between the cylindrical outer surface 52, which creates a pair of edges 66a, 66b of the straight edge 60. The straight edge 60 and the bottom surface 54 are a coupler target. That is, the pair of edges 66a, 66b are where the straight edge 60 intersects with the cylindrical outer surface 52. As such, the bottom surface 54 is generally a half-moon or semi-circular shape. It should be appreciated that in some embodiments, the cylindrical outer surface 52 may be milled, machined, and/or the like such that the target coupler is reduced in size such that the pair of edges 66a, 66b of the straight edge 60 would be more inboard in this embodiment. As best seen in FIG. 1B, the edges 66a, 66b and the cylindrical outer surface 52 may be positioned over the transmitter coil 16 while the straight edge 60 traverses the two-part receiving coil 22 and extends over at least a portion of the transmitter coil 16.

In operation, the first end 12 of the shaft 14 is rotated or moved about the shaft axis 13. In some embodiments, the shaft axis 13 is coaxially aligned with the central axis 68. The straight edge 60 rotates or moves at a first distance from the transmitter coil 16 and the two-part receiving coil 22. The rotation or movement of the straight edge 60 and the bottom surface 54 of the cylindrical outer surface 52 of the first end 12 is detected by the sensor assembly 10. On the other hand, the undercut surface 64 of the undercut portion 58 is at a second distance from the first and the second receiving coils 24, 26 and the transmitter coil 16. The second distance is greater than the first distance such that the undercut surface 64 of the undercut portion 58 of the first end 12 is not be detected by the sensor assembly 10, but the straight edge 60 and bottom surface 54 are detected. It should be appreciated that the depth of the undercut surface 64 in the axial or vertical direction (i.e., in the +/−Z-direction) is selected with a relationship to the sensor assembly 10 based on a strength of the signal required to sense or detect the straight edge 60 and bottom surface 54 and not detect the undercut surface 64.

For example, and not by way of limitation, the depth of the undercut portion 58 in the axial or vertical direction (i.e., in the +/−Z-direction) may be generally greater than 4 millimeters and distance between the bottom surface 54 including the straight edge 60 and the two-part receiving coil 22 may generally be between 1 millimeter to 3 millimeters.

As such, only the straight edge 60 and/or the bottom surface 54 may be detected by the sensor assembly 10. As such, it is appreciated that the geometries formed into the first end 12 of the shaft 14 are detected by the sensor assembly 10.

It should also be appreciated that the geometric arrangement of the target coupler formed in the first end 12 of the shaft 14 and the sensor assembly 10 arrangement corrects a nonsinusoidal input signal to the signal processor 702. That is, the sensor assembly 10 produces a sinusoidal curve in a polar coordinate system when detecting the geometries formed into the first end 12 of the shaft 14, in the form of the following parametric equation:

$$\begin{cases} x(t) = (a + b*\cos(N*t))*\cos(t) \\ y(t) = (a + b*\cos(N*t))*\sin(t) \end{cases}, 0 \le t \le 360°$$

where a=the average radii of the rotor; b=the difference between a and the maximum radii of the rotor; N=pole number of the rotor; and t=parametric parameter varying from 0 to 360 degrees.

Further, it should be appreciated that the geometric arrangement of the target coupler formed in the first end 12 of the shaft 14 and the sensor arrangement of the sensor assembly 10 allows for high order geometry harmonics to be included in the coil shape so as to further improve the sensor linearity errors. As such, the coil sinusoidal curve then becomes the following parametric equation:

$$\begin{cases} x(t) = (a + b*\cos(N*t) + b_3*\cos(3N*t) + \ldots\ )*\cos(t) \\ y(t) = (a + b*\cos(N*t) + b_3*\cos(3N*t) + \ldots\ )*\sin(t) \end{cases}, 0 \le t \le 360°$$

where a=the average radii of the rotor; b=the difference between a and the maximum radii of the rotor; N=pole number of the rotor; b3=the coil shape; and t=parametric parameter varying from 0 to 360 degrees.

Figure 2A:
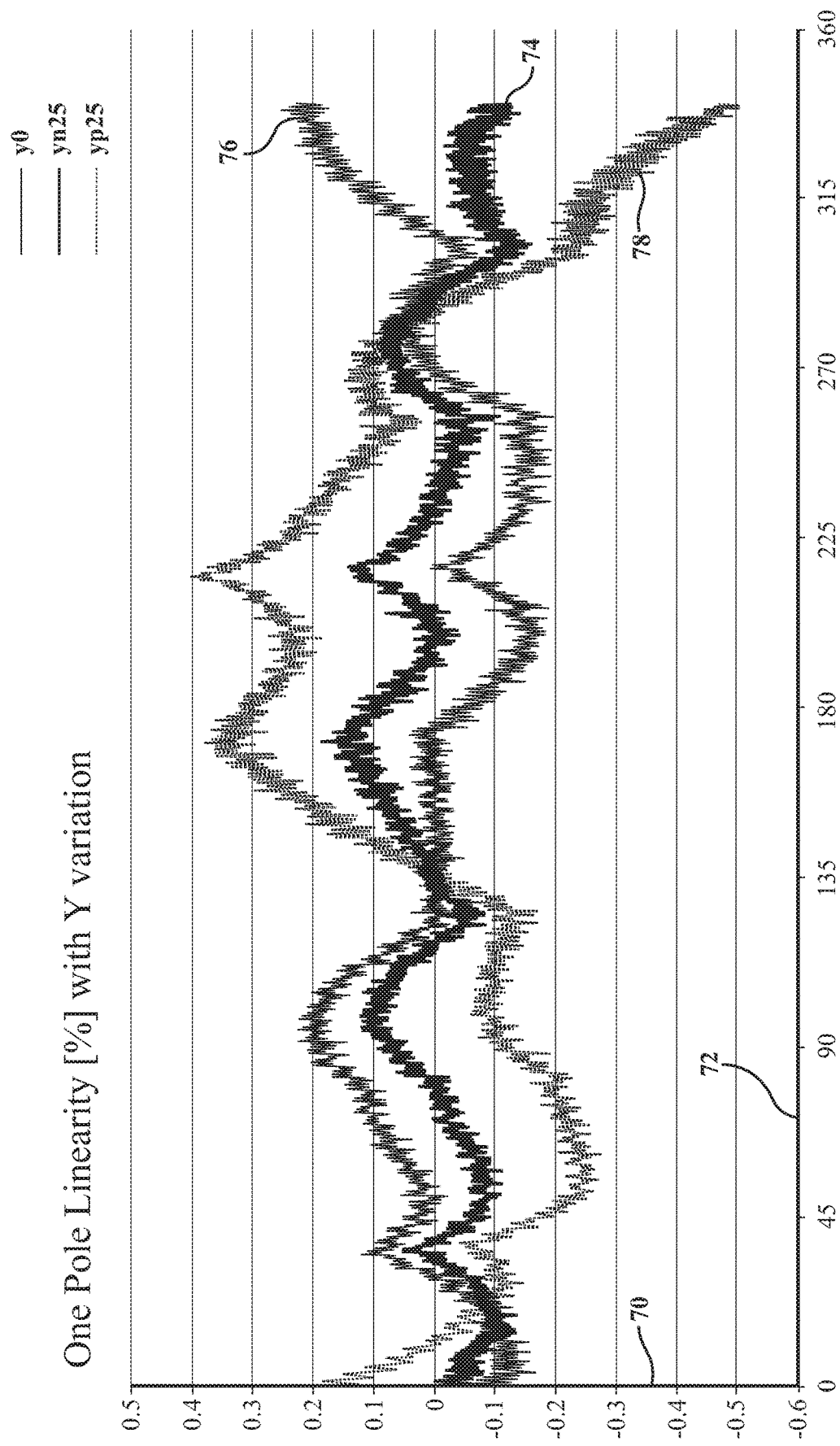
FIG. 2A schematically depicts a graph of the one-pole linearity percentages with a Y-variation according to one or more embodiments shown and described herein.

Now referring to FIG. 2A the one pole linearity percentage with a Y variation is shown. An ordinate 70 represents a one pole linearity percentage and an abscissa 72 represents degrees. As shown in FIG. 2A, the Y variation includes three plots, a y0 plot 74 representing the linearity when the shaft is centered with the coil, a yn25 plot 76 representing the linearity when the shaft is shifted by 0.25 mm along −Y direction, and a yp25 plot 78 representing the linearity when the shaft is shifted by 0.25 mm along +Y direction. Each plot 74, 76, 78 ranges from approximately 0.2 to −0.2 and each plot 74, 76, 78 are generally a sinusoidal curve plotting above and below the zero percentage with the y0 plot 74 appearing to be the most consistent. The linearity with Y offset has the similar linearity due to the geometry symmetricity. FIG. 2A illustrates that the linearity is insensitive to the X and Y offset and therefore the sensor assembly 10 is tolerable to the mechanical concentricity error.

Figure 2B:
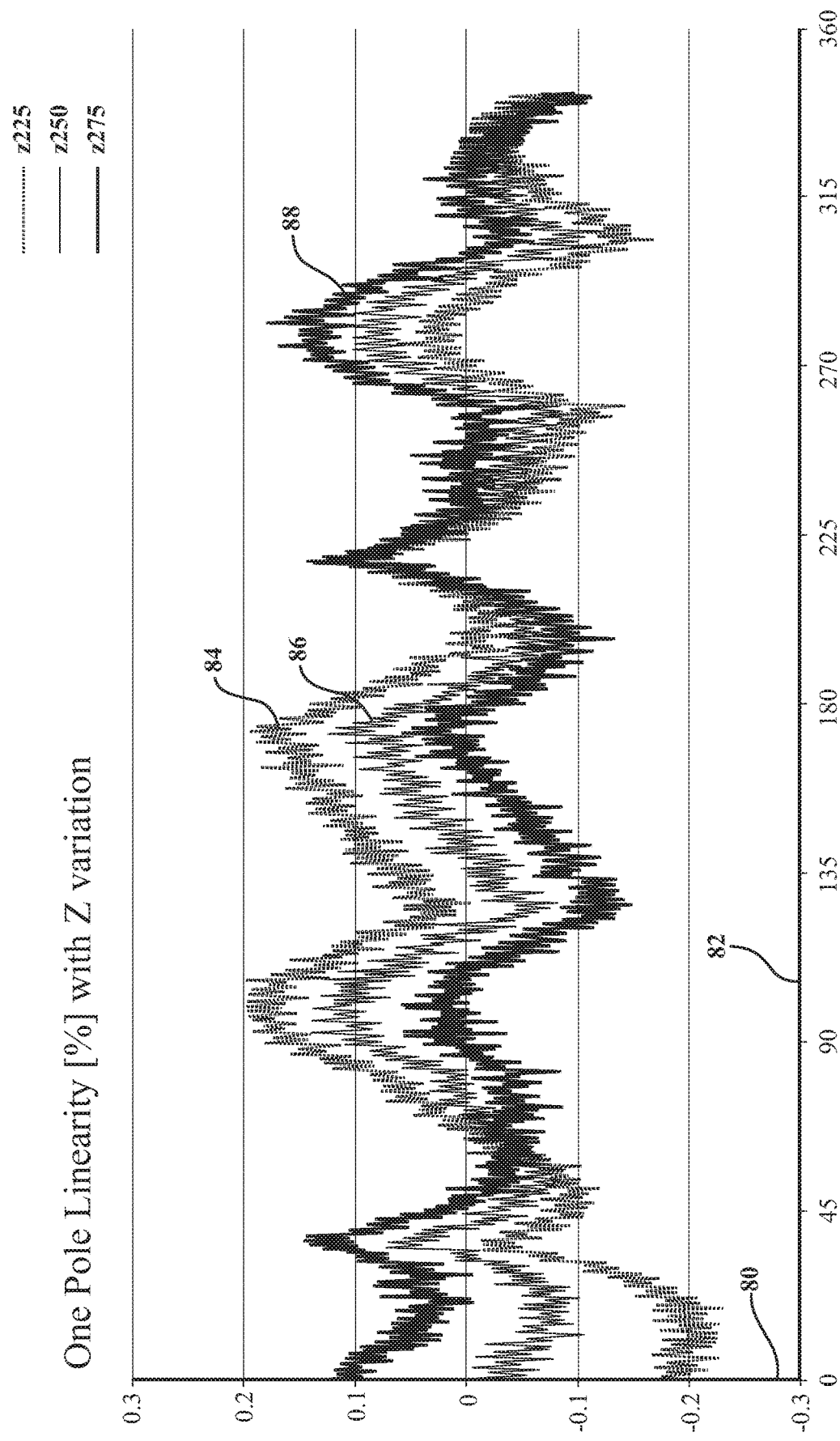
FIG. 2B schematically depicts a graph of the one-pole linearity percentages with a Z-variation according to one or more embodiments shown and described herein.

Now referring to FIG. 2B a one pole linearity percentage test result with a Z variation is shown. An ordinate 80 represents a one pole linearity percentage and an abscissa 82 represents degrees. As shown in FIG. 2B, the Z variation includes three plots, the Z225 plot 84 representing the linearity at 2.25 mm air gap, the z250 plot 86 representing the linearity at 2.50 mm air gap, and the z275 plot 88 representing the linearity at 2.75 mm air gap. Each plot 84, 86, 88 ranges from about 0.2 to −0.2 and each plot 84, 86, 88 are generally a sinusoidal curve plotting above and below the zero percentage. FIG. 2B illustrates that the linearity is insensitive to the air gap variation and therefore the sensor assembly 10 is tolerable to the airgap variation.

With reference now to FIGS. 3A-3E, a two pole sensor assembly 100 is schematically depicted. The two pole sensor assembly 100 includes a sensor assembly 110 and a shaft 114 having a first end 112. It should be appreciated that only a portion the shaft 114 is illustrated and that the shaft 114 may be any width, diameter, radius, and/or the like. The two pole sensor assembly 100 includes a transmitter coil 116. The transmitter coil 116 is generally circular in shape and has a predetermined inner diameter 118 and a predetermined outer diameter 120. The transmitter coil 116 may be powered by an alternating current source (not shown) to produce an electromagnetic carrier flux.

The sensor assembly 110 further includes a two-part receiving coil 122. The two-part receiving coil 122 includes a first receiving coil 124, a second receiving coil 126, and a central region 132. The central region 132 further includes a central axis 168. The first receiving coil 124 may include a plurality of hook shaped coils 128a. In embodiments, the plurality of hook shaped coils 128a tangentially extend radially outward from the central region 132 of the two-part receiving coil 122 towards the transmitter coil 116. Each hook of the plurality of hook shaped coils 128a includes a shank portion 190a, a throat portion 192a, a bend portion 194a, and a point portion 196a. The shank portion 190a extends radially from the central region 132 of the two-part receiving coil 122. The throat portion 192a may be partially or fully arcuate or curvilinear. The point portion 196a extends radially from the bend portion 194a at the transmitter coil 116 in a direction away from the transmitter coil 116 and towards the central region 132 of the two part receiving coil 122. In general, it is appreciated that each of the hook shaped coils of the plurality of hook shaped coils 128a begins by extending radially outward from a position near the central axis 168 and ends at a position near the transmitter coil 116 and has a generally arcuate or curvilinear portion between the beginning and ending of the coil. In some embodiments, the point portion 196a is an L-shaped extension, a linear extension, a curvilinear extension, and/or the like and may be uniform and symmetrically. In other embodiments the L-shaped extension, the linear extension, the curvilinear extension, and/or the like of the point portion 196a is irregular and/or unsymmetrical (i.e., not uniform). It should be appreciated that each bend portion 194a may define the outer region or circumference of the first receiving coil 124. The circumference or outer region may be adjacent to or overlap a portion of the inner diameter 18 of the transmitter coil 16. That is, it is appreciated that the bend portion 194a and/or a portion of the throat portion 192a may partially or fully overlap or underlap a portion of the inner diameter 118 of the transmitter coil 116. In embodiments, each of the plurality of hook shaped coils 128a of the first receiving coil 124 are symmetric in shape. In other embodiments, any of the plurality of hook shaped coils 128a of the first receiving coil 124 are not symmetric.

Connection junctions 134c may be disposed at an end of each shank portion 190a of the plurality of hook shaped coils 128a of the first receiving coil 24. In some embodiments, each of the connection junctions 134c at each shank portion 190a may generally be an L-shaped extension, a linear extension, a curvilinear extension, and/or the like and generally extend from the shank portion 190a in a direction offset or bent with respect to the shank portion. It should be appreciated that in some embodiments the L-shaped extension, the linear extension, the curvilinear extension, and/or the like of the connection junctions 134c may be uniform and symmetrically. In other embodiments the L-shaped extension, the linear extension, the curvilinear extension, and/or the like of the connection junctions 134c may be irregular and unsymmetrically (i.e., not uniform) and offset from one another. It should be appreciated that the number of connection junctions 134c may depend on the number of coils, and, as such, embodiments described herein are non-limiting examples thereof.

Connection junctions 134a may be disposed at an end of each point portion 196a of the plurality of hook shaped coils 128a of the first receiving coil 124. In some embodiments, each of the connection junctions 134a at each point portion 196a may be at the distal end of the L-shaped extension, the linear extension, the curvilinear extension, and/or the like of the point portion 196a so to generally extend in a direction away from the transmitter coil 116. It should be appreciated that the number of connection junctions 134a may depend on the number of coils, and, as such, embodiments described herein are non-limiting examples thereof.

In embodiments, each of the connection junctions 134a at the point portion 196a and the connection junctions 134c at the shank portion 190a may be arranged such that the connection junctions 134a, 134c are positioned or angled towards the central region 132. In some embodiments, the plurality of hook shaped coils 128a of the first receiving coil 124 further include additional or supplemental connection junctions 134b disposed along the shank portion 190a and/or the throat portion 192a. It should be appreciated that the additional or supplemental connection junctions 134b may be disposed along anywhere on the plurality of hook shaped coils 128a. The connection junctions 134b may be disposed at a point of a hook portion 140. The hook portion 140 may hook or bend towards and/or away from the central region 132.

The second receiving coil 126 may include a plurality of hook shaped coils 128b. In embodiments, the plurality of hook shaped coils 128b tangentially extend radially outward from the central region 132 of the two-part receiving coil 122 towards the transmitter coil 116. Each hook of the plurality of hook shaped coils 128b includes a shank portion 190b, a throat portion 192b, a bend portion 194b, and a point portion 196b. The shank portion 190b extends radially from the central region 132 of the two-part receiving coil 122. The throat portion 192b may be partially or fully arcuate or curvilinear. The point portion 196b extends radially from the bend portion 194b at the transmitter coil 116 in a direction away from the transmitter coil 116 and towards the central region 132 of the two part receiving coil 122. In general, it is appreciated that each of the hook shaped coils of the plurality of hook shaped coils 128b begins by extending radially outward from a position near the central axis 168 and ends at a position near the transmitter coil 116 and has a generally arcuate or curvilinear portion between the beginning and ending of the coil. In some embodiments, the point portion 196b is an L-shaped extension, a linear extension, a curvilinear extension, and/or the like and may be uniform and symmetric. In other embodiments the L-shaped extension, the linear extension, the curvilinear extension, and/or the like of the point portion 196b is irregular and unsymmetrical (i.e., not uniform). It should be appreciated that each bend portion 194b may define the outer region or circumference of the second receiving coil 126. The circumference or outer region may be adjacent to or overlap a portion of the inner diameter 118 of the transmitter coil 116. That is, it is appreciated that the bend portion 194b and/or a portion of the throat portion 192b may partially or fully overlap or underlap a portion of the inner diameter 118 of the transmitter coil 116. In embodiments, each of the plurality of hook shaped coils 128b of the second receiving coil 126 are symmetric in shape. In other embodiments, any of the plurality of hook shaped coils 128b of the second receiving coil 126 are not symmetric.

Connection junctions 142c may be disposed at an end of each shank portion 190b of the plurality of hook shaped coils 128b of the second receiving coil 126. In some embodiments, each of the connection junctions 142c at each shank portion 190b may generally be an L-shaped extension, a linear extension, a curvilinear extension, and/or the like and generally extend from the shank portion 190b in a direction offset or bent with respect to the shank portion 190b. It should be appreciated that in some embodiments the L-shaped extension, the linear extension, the curvilinear extension, and/or the like of the connection junctions 142c may be uniform and symmetric. In other embodiments the L-shaped extension, the linear extension, the curvilinear extension, and/or the like of the connection junctions 142c may be irregular and unsymmetrical (i.e., not uniform) and offset from one another. It should be appreciated that the number of connection junctions 142c may depend on the number of coils, and, as such, embodiments described herein are non-limiting examples thereof.

Connection junctions 142a may be disposed at an end of each point portion 196b of the plurality of hook shaped coils 128b of the second receiving coil 126. In some embodiments, each of the connection junctions 142a at each point portion 196b may be at the distal end of the L-shaped extension, the linear extension, the curvilinear extension, and/or the like of the point portion 196b so to generally extend in a direction away from the transmitter coil 116. It should be appreciated that the number of connection junctions 142a may depend on the number of coils, and, as such, embodiments described herein are non-limiting examples thereof.

In embodiments, each of the connection junctions 142a at the point portion 196b and the connection junctions 142c at the shank portion 190b may be arranged such that the connection junctions 142a, 142c are positioned or angled towards the central region 132. In some embodiments, the plurality of hook shaped coils 128b of the second receiving coil 126 further include additional or supplemental connection junctions 142b disposed along the shank portion 190b and/or the throat portion 192b. It should be appreciated that the additional or supplemental connection junctions 142b may be disposed along anywhere on the plurality of hook shaped coils 128b. The connection junctions 142b may be disposed at a point of a curved portion 148. The curved portion 148 may hook or bend towards and/or away from the central region 132.

It should be appreciated that the connection junctions 134c of the plurality of hook shaped coils 128a of the first receiving coil 124 and connection junctions 142c of the plurality of hook shaped coils 128b of the second receiving coil 126 align in an axial direction or in the vertical direction (i.e., in the +/−Z-direction) so to communicatively couple to one another. In embodiments, the coupling of the connection junctions 134c and the connection junctions 142c define a circumference of the central region 132. In embodiments, due to each of the plurality of hook shaped coils 128a and each of plurality of hook shaped coils 128b being a pair of coils, traces, and the like and with the directions of the connection junctions 134c, 142c offset or bent with respect to the shank portion and with respect to each pair, the connection junctions 134c, 142c may define two circumferences, one being the central region 132 and the other being another region that is radially outward from the central region 132.

In some embodiments, each of the plurality of hook shaped coils 128a and each of plurality of hook shaped coils 128b are a pair of coils, traces, and the like. In other embodiments, each of the plurality of hook shaped coils 128a and each of the plurality of hook shaped coils 128b are singular or have more than two coils, traces, and the like. The plurality of hook shaped coils 128a of the first receiving coil 124 and the plurality of hook shaped coils 128b of the second receiving coil 126 are oppositely wound and/or offset in opposite directions such that the coils are oppositely facing around the central region 132, as best seen in FIGS. 3D-3E. It is appreciated that the first receiving coil 124 and the second receiving coil 126 may be identically offset using the equation $$\frac{90}{N}$$

degrees where 1N is equal to the number of poles. As such, the plurality of hook shaped coils 128a of the first receiving coil 124 and the plurality of hook shaped coils 128b of the second receiving coil 126 are offset from one another such that the connection junctions 134a, 134b, 134c of the first receiving coil 124 align with the connection junctions 142a, 142b, 142c of the second receiving coil 126. In some embodiments, the corresponding of the connection junctions 134a, 134b, 134c of the first receiving coil 124 to the connection junctions 142a, 142b, 142c of the second receiving coil 126 permit communication and/or receiving of flux changes associated with the first end 112 of the shaft 114, as discussed in greater detail herein.

The first receiving coil 124 and the second receiving coil 126 may be positioned in different layers of the PCB 130 in the axial direction or in the vertical direction (i.e., in the +/−Z-direction) such that a difference in the distance or airgap from the first end 112 of shaft 114 is created, similar to that as described with reference to FIG. 1H with respect to the sensor assembly 10. That is, each one of the plurality of hook shaped coils 128a of first receiving coil 124 is in one layer of the PCB 130 and each one of the plurality of hook shaped coils 128b of the second receiving coil 126 are all together in a different layer of the PCB 130 from each one of the plurality of hook shaped coils 128a of first receiving coil 124. In some embodiments, the first receiving coil 124 and the second receiving coil 126 may be positioned in adjacent or adjoining layers. In other embodiments, the first receiving coil 124 and the second receiving coil 126 may be positioned in layers that are spaced apart or separated by another layer that may be unoccupied or may contain other coils (i.e. a portion of the transmitter coil and the like). It should be appreciated that the depth of the first receiving coil 124 and the depth of the second receiving coil 26 in the axial or vertical direction (i.e., in the +/−Z-direction) are selected with a relationship to the first end 112 of the shaft 114 based on a strength of the signal required for the airgap or distance.

Figure 3A:
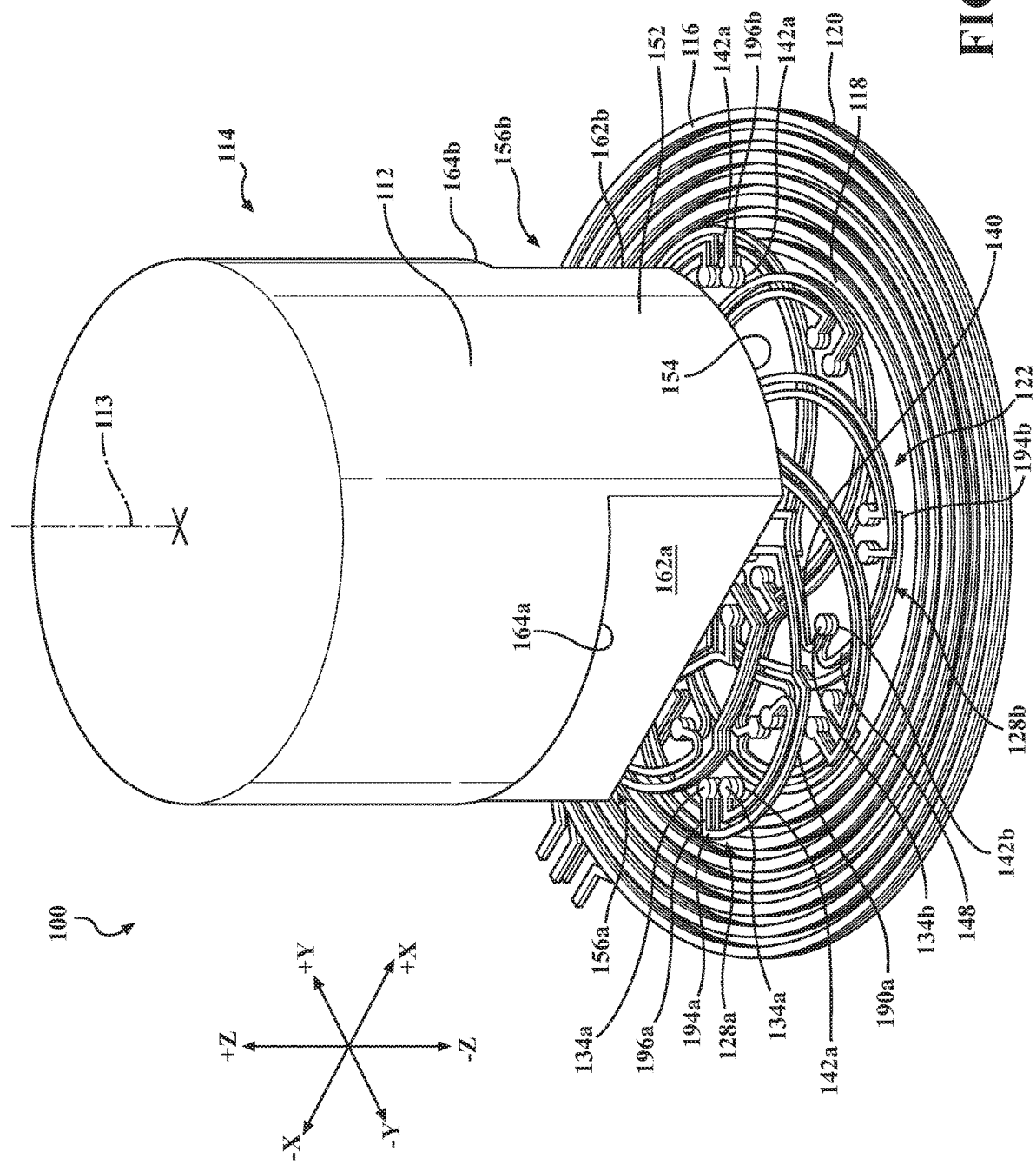
FIG. 3A schematically depicts a perspective view of a two pole sensor assembly according to one or more embodiments shown and described herein.
Figure 3B:
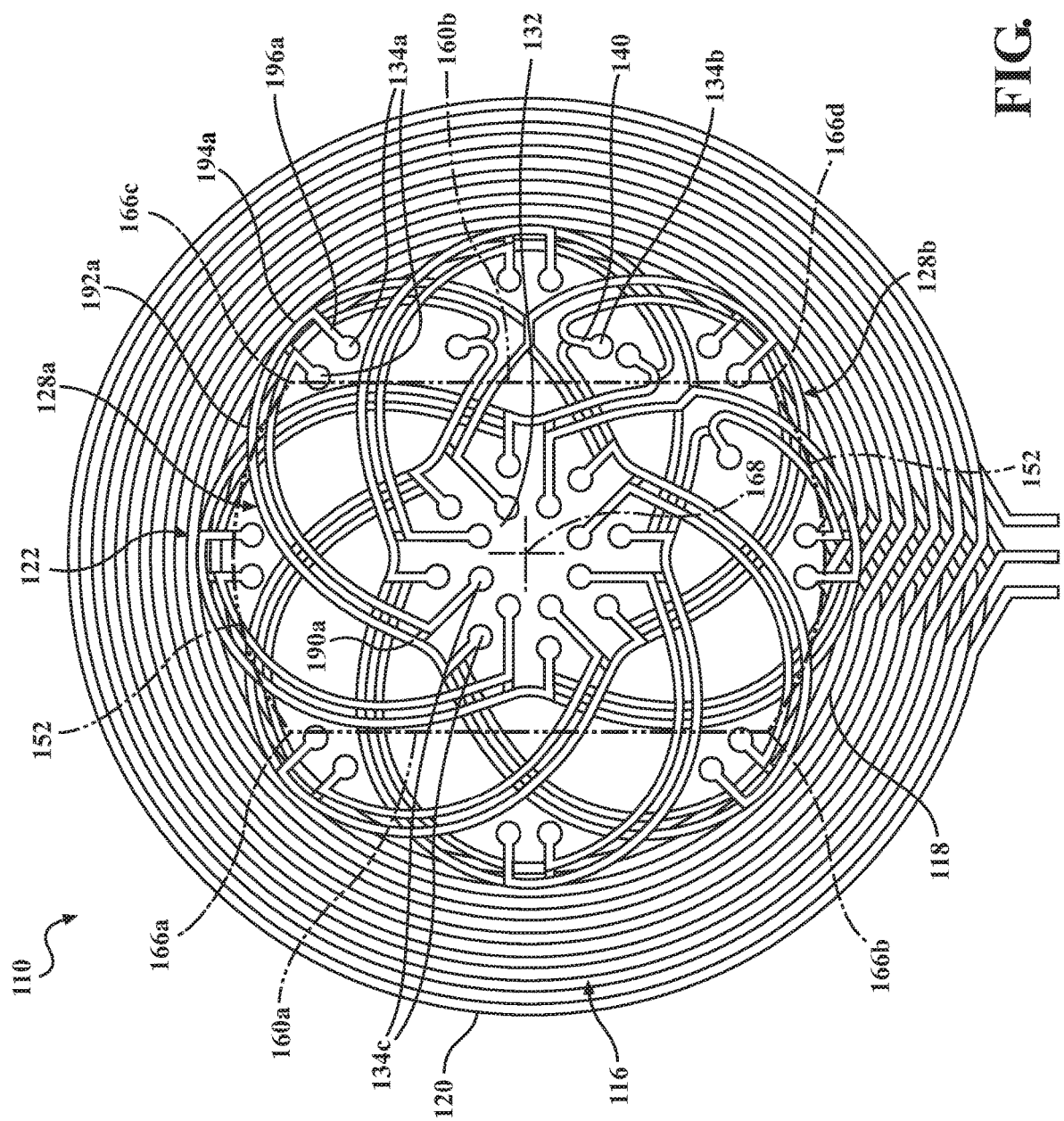
FIG. 3B schematically depicts a top view of the sensor assembly of FIG. 3A highlighting a coupler element in communication with a sensor according to one or more embodiments shown and described herein.

As such, portions of the first receiving coil 124 overlap portions of the second receiving coil 126 and portions of the second receiving coil 126 under lap portions of the first receiving coil 124, as best seen in FIG. 3A-3B for this embodiment and shown in the cross-sectional view of FIG. 1H with respect to the sensor assembly 10. As such, it should be appreciated that the overlap portions are not connected with the path of the coil above and/or below, and that this coil arrangement permits sensing of the first end 112 of the shaft 114 from different distances or air gaps and permits the first receiving coil 124 and the second receiving coil 126 to act as independent coils. In yet other embodiments, portions of the first receiving coil 124 and the second receiving coil 126 are disposed within the same layer of the PCB 130 so to have the same depth in the vertical direction (i.e., in the +/−Z-direction) or airgap from the first end 112 of shaft 114.

It should also be appreciated that the plurality of hook shaped coils 128a of first receiving coil 124 and the plurality of hook shaped coils 128b of the second receiving coil 126 are depicted as each having eight coils, but this is a non-limiting example and the two-part receiving coil 122 may have more or less. In addition, it should be appreciated that there may be more hook shaped coils 128a in the first receiving coil 124 than in the second receiving coil 126, and vice versa. Further, it should be appreciated that the plurality of hook shaped coils 128a of first receiving coil 124 and the plurality of hook shaped coils 128b of the second receiving coil 126 may be coplanar with the transmitter coil 116 or may be in parallel planes with each other and/or with the transmitter coil 116.

It should be appreciated that the sensor assembly 110 utilizes the transmitter coil 116 as described with respect to the sensor assembly 10. In particular, with reference to FIGS. 1F-1G and FIGS. 3A-3C, the transmitter coil 116 includes two parts, an upper coil 16a and a lower coil 16b interlaced between two layers of the PCB 130. Each part of the transmitter coil 16 is generally circular and extends at least the diameter of the target coupler, as discussed in greater detail herein. Further, the upper coil 16a has an inner diameter 18a and an outer diameter 20a and the lower coil 16b has an inner diameter 18b and an outer diameter 20b. The inner and outer diameters of the upper and lower coils 16a, 16b form the inner diameter 118 and outer diameter 120 of the transmitter coil 116. For brevity reasons, the remaining description of the transmitter coil 116 are omitted here and can be found in greater detail above.

Now referring back to FIGS. 3A-3E, the first end 112 of the shaft 114 will be described. The shaft 114 may be an elongated member having the first end 112 and a second end (not shown). It should be appreciated that the second end may be attached to a device (not shown) such that the second end rotates or moves (i.e., linearly, curvilinear, elliptically, and the like) about the shaft axis 113. The shaft 114 may be any material suitable for influencing, changing, modifying, and the like, the electromagnetic field or the magnetic flux and/or that makes the shaft a coupler such that the coupling may be detected by the sensor assembly 110.

The first end 112 is integrally formed from the shaft 114. That is the first end 112 is the shaft 114, but incorporating geometrical differences as discussed in greater herein. As such, the first end 112 includes a cylindrical outer surface 152 and a bottom surface 154. The bottom surface 154 is planar. The cylindrical outer surface 152 may be milled, machined, and/or the like so to incorporate the geometric differences such as forming two flat portions 156a, 156b in the cylindrical outer surface 152, which creates two undercut portions 158a, 158b. That is, each flat portion of the two flat portions 156a, 156b may be formed by removing the cylindrical outer surface 152 radially from the shaft axis 113. Each of the two undercut portions 158a, 158b has a void or is missing shaft material. That is, creating the two flat portions 156a, 156b, in the cylindrical outer surface 152 shaves or removes a portion of the cylindrical outer surface 152 and a portion of the bottom surface 154 such that portions of the cylindrical outer surface 152 and the bottom surface 154 of the first end 112 are removed. By creating the two flat portions 156a, 156b, formed in the cylindrical outer surface 152, the two undercut portions 158a, 158b, are created having undercut surfaces 164a, 164b. The undercut surfaces 164a, 164b are each a second planar surface spaced apart from the bottom surface 154. The two undercut portions 158a, 158b are identical (i.e., are uniform and symmetrical in shape and size). It should be appreciated that in some embodiments, each of the two undercut portions 158a, 158b may not be uniform and/or symmetrical in shape and size. The two flat portions 156a, 156b each include a wall 162a, 162b extending coaxially with the shaft axis 113 towards the second end (not shown) and terminating at an upper end at each respective undercut surface 164a, 164b. As best seen in FIG. 3A, a lower end of each wall 162a, 162b terminates at the bottom surface 154, which forms straight edges 160a, 160b. Each straight edge 160a, 160b extends between the cylindrical outer surface 152, which creates a pair of edges 166a, 166b of the straight edge 160a and a pair of edges 166c, 166d for the straight edge 160b. The straight edges 160a, 160b and the bottom surface 154 are a coupler target. That is, the pair of edges 166a, 166b are where the straight edge 160a intersects with the cylindrical outer surface 152 and the pair of edges 166a, 166b are where the straight edge 160b also intersects with the cylindrical outer surface 152

Figure 3C:
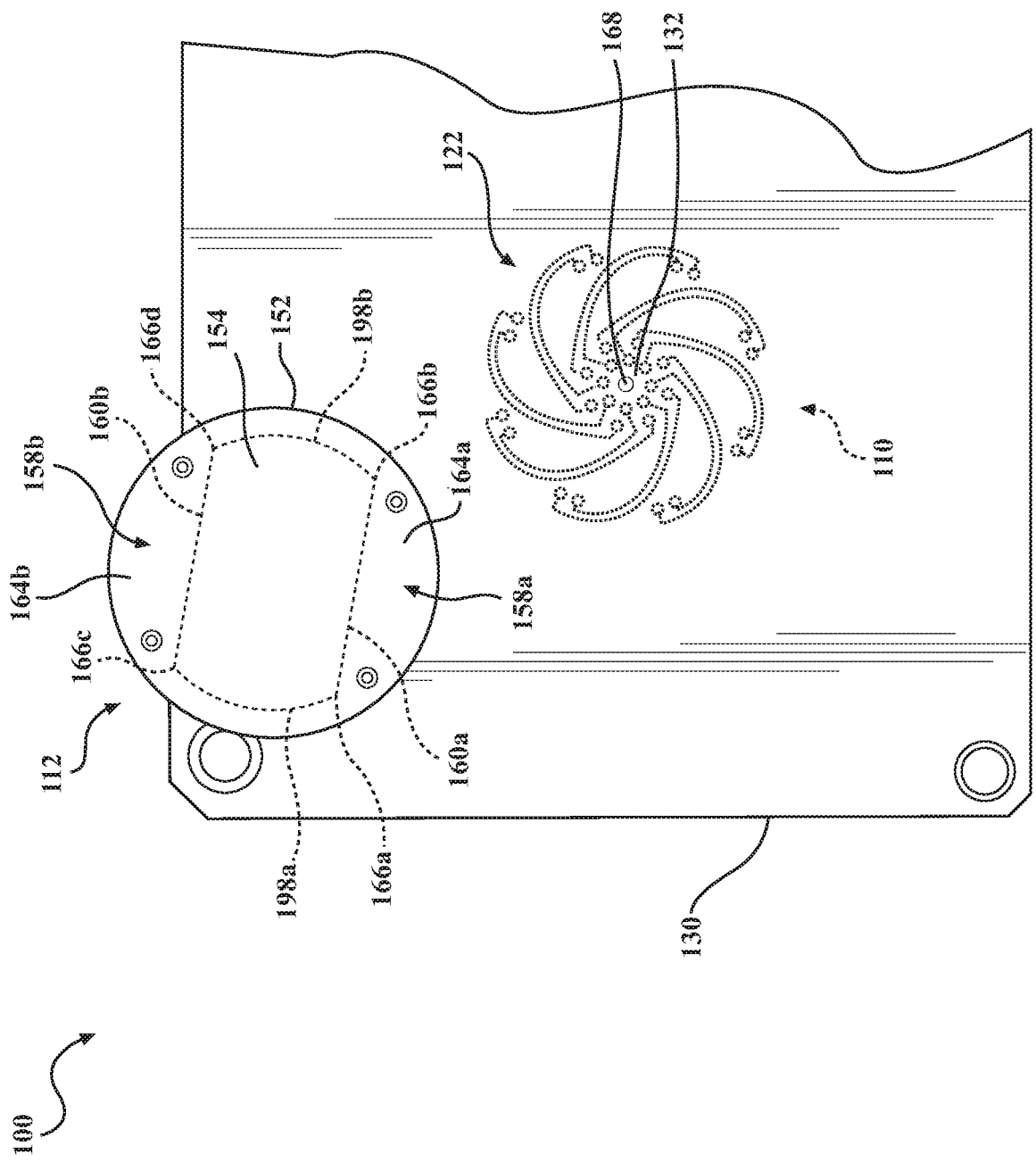
FIG. 3C schematically depicts a top view of the sensor assembly of FIG. 3A including a top view of the sensor and the end-of-shaft of FIG. 3A according to one or more embodiments shown and described herein.
Figure 3E:
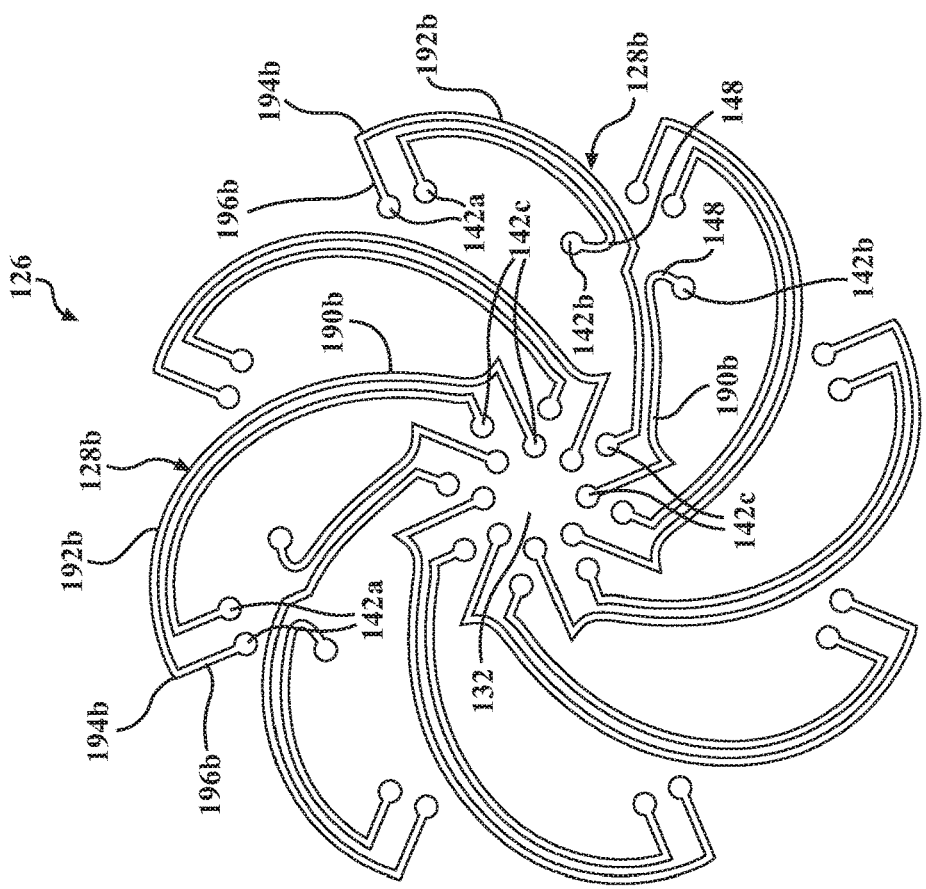
FIG. 3E schematically depicts an isolated top view of a second receiving coil of the sensor assembly of FIG. 3A according to one or more embodiments shown and described herein.
Figure 3D:
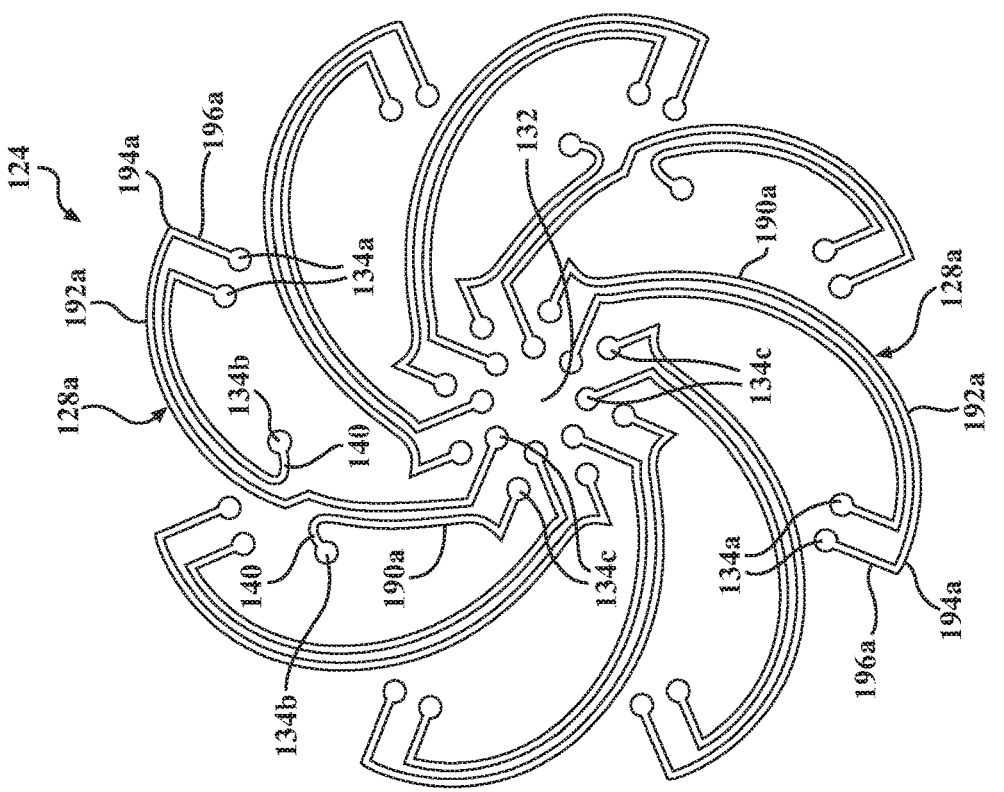
FIG. 3D schematically depicts an isolated top view of a first receiving coil of the sensor assembly of FIG. 3A according to one or more embodiments shown and described herein.

It should be appreciated that in some embodiments, the cylindrical outer surface 152 may be milled, machined, and/or the like such that the target coupler is reduced in size having a pair of arcuate surfaces 198a, 198b separating the straight edges 160a, 160b and having a diameter less than the diameter of the cylindrical outer surface 152, as shown in FIG. 3C. The pair of edges 166a, 166b of the straight edge 160a and the pair of edges 166c, 166d of the straight edge 160b would be more inboard in this embodiment. The straight edges 160a, 160b and the cylindrical outer surface 152 may be positioned over the two-part receiving coil 122.

In operation, the first end 112 of the shaft 114 is rotated or moved about the shaft axis 113 such that the straight edges 160a, 160b rotate or move at a first distance from the transmitter coil 116 and the two-part receiving coil 122. In some embodiments, the straight edges 160a, 160b and the cylindrical outer surface 152 rotate about the shaft axis 113 and within the inner diameter 118 of the transmitter coil 116. In other embodiments, the straight edges 160a, 160b and/or the cylindrical outer surface 152 extends over at least a portion of the transmitter coil 16. The rotation or movement of the straight edges 160a, 160b and the bottom surface 154 of the first end 112 is detected by the sensor assembly 110. On the other hand, the undercut surfaces 164a, 164b of the two undercut portions 158a, 158b are at a second distance from the first and the second receiving coils 124, 126 and the transmitter coil 116. The second distance is greater than the first distance in the axial or vertical direction (i.e. in the +/−Z-direction) such that the undercut surfaces 164a, 164b of the undercut portions 138a, 138b are not detected by the sensor assembly 110, but the straight edges 160a, 160b and the bottom surface 154 are detected. It should be appreciated that the depth of the two undercut portions 158a, 158b and the undercut surfaces 164a, 164b in the axial or vertical direction (i.e., in the +/−Z-direction) is selected with a relationship to the sensor assembly 110 based on a strength of the signal required to sense or detect the straight edges 160a, 160b and the bottom surface 154 and not detect the undercut surfaces 164a, 164b. For example, and not by way of limitation, the depth of the undercut surfaces 164a, 164b may be generally greater than 4 millimeters and distance between the bottom surface 154 including the straight edges 160*a*, 160*b* and the sensor assembly 110 may generally be between 1 millimeter to 3 millimeters. As such, only the straight edges 160*a*, 160*b* and/or the bottom surface 154 may be detected by the sensor assembly 110.

As such, it is appreciated that the geometric arrangement of the target coupler formed in the first end 112 of the shaft 114 and the sensor assembly 110 arrangement corrects a nonsinusoidal input signal to the signal processor 702. That is, the sensor assembly 110 produces a sinusoidal curve in a polar coordinate system when detecting the geometries formed into the first end 112 of the shaft 114, as discussed in greater detail herein. Further, the geometric arrangement of the target coupler formed in the first end 112 of the shaft 114 and the arrangement of the coils in the sensor assembly 110 eliminate harmonics when detecting the geometries formed into the first end 112 of the shaft 114, as discussed in greater detail herein.

Figure 4A:
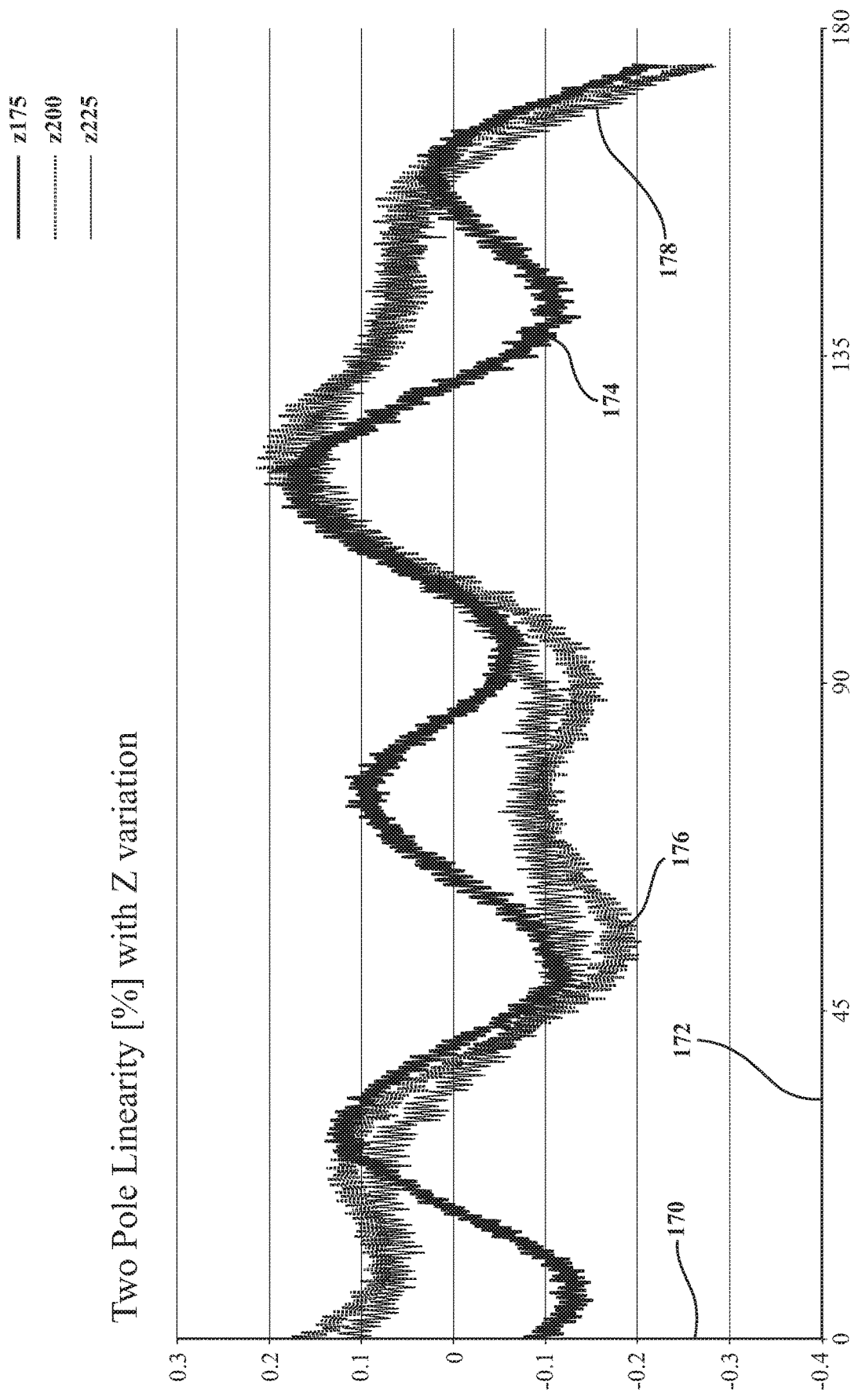
FIG. 4A schematically depicts a graph of the one-pole linearity percentages with a Y-variation according to one or more embodiments shown and described herein.

Now referring to FIG. 4A the two pole linearity percentage with a Z-axis variation is shown. The ordinate 170 represents a two pole linearity percentage and an abscissa 172 represents degrees. As depicted in FIG. 4A, the Z variation includes three plots, a z175 plot 174 representing the linearity at 1.75 mm air gap, a z200 plot 176 representing the linearity at 2 mm air gap, and a z225 plot 178 representing the linearity at 2.25 mm air gap. Each plot 174, 176, 178 ranges from about 0.2 to −0.2 and is generally a sinusoidal curve plotting above and below the zero percentage with the z175 plot 174 being the most consistent. FIG. 4A illustrates that the linearity is insensitive to the air gap variation and that the two pole sensor assembly 100 is tolerable to the airgap variation.

Now referring to FIG. 4B the two pole linearity percentage with an X variation is shown. An ordinate 180 represents a two pole linearity percentage and an abscissa 182 represents degrees. As shown in FIG. 4B, an X variation includes three plots, an x=0 mm plot 184 representing the linearity when the shaft is centered with the coil, x=−0.25 mm plot 186 representing the linearity when the shaft is shifted by 0.25 mm along −x direction, and an x=0.25 mm plot 188 representing the linearity when the shaft is shifted by 0.25 mm along +x direction. Each plot 184, 186, 188 ranges from about 0.2 to −0.4 and is generally a sinusoidal curve plotting above and below the zero percentage. The linearity with Y offset has the similar linearity due to the geometry symmetricity. FIG. 4B illustrates that the linearity is insensitive to the X and Y offset and that the two pole sensor assembly 100 is tolerable to the mechanical concentricity error.

With reference now to FIGS. 5A-5D, a three pole sensor assembly 200 is schematically depicted. The three pole sensor assembly 200 includes a sensor assembly 210 and a shaft 214 having a first end 212. It should be appreciated that only a portion the shaft 214 is illustrated and that the shaft 214 may be any width, diameter, radius, and/or the like. The three pole sensor assembly 200 includes a transmitter coil 216. The transmitter coil 216 is generally circular in shape and has a predetermined inner diameter 218 and a predetermined outer diameter 220. The transmitter coil 216 may be powered by an alternating current source (not shown) to produce an electromagnetic carrier flux.

The sensor assembly 210 further includes a two-part receiving coil 222. The two-part receiving coil 222 includes a first receiving coil 224, a second receiving coil 226, and a central region 232. The central region 232 further includes a central axis 268. The first receiving coil 224 may include a plurality of hook shaped coils 228*a*. In embodiments, the plurality of hook shaped coils 228*a* tangentially extend radially outward from the central region 232 of the two-part receiving coil 222 towards the transmitter coil 216. Each hook of the plurality of hook shaped coils 228*a* includes a shank portion 290*a*, a throat portion 292*a*, a bend portion 294*a*, and a point portion 296*a*. The shank portion 290*a* extends radially from the central region 232 of the two-part receiving coil 222. The throat portion 292*a* may be partially or fully arcuate or curvilinear. The point portion 296*a* extends radially from the bend portion 294*a* at the transmitter coil 216 in a direction away from the transmitter coil 216 and towards the central region 232 of the two-part receiving coil 222. In general, it is appreciated that each of the hook shaped coils of the plurality of hook shaped coils 228*a* begins by extending radially outward from a position near the central axis 268 and ends at a position near the transmitter coil 216 and has a generally arcuate or curvilinear portion between the beginning and ending of the coil. In some embodiments, the point portion 296*a* is an L-shaped extension, a linear extension, a curvilinear extension, and/or the like and may be uniform and symmetrically. In other embodiments the L-shaped extension, the linear extension, the curvilinear extension, and/or the like of the point portion 296*a* is irregular and unsymmetrically (i.e., not uniform). It should be appreciated that each bend portion 294*a* may define the outer region or circumference of the first receiving coil 224. The circumference or outer region may be adjacent to or overlap a portion of the inner diameter 218 of the transmitter coil 216. That is, it is appreciated that the bend portion 294*a* and/or a portion of the throat portion 292*a* may partially or fully overlap or underlap a portion of the inner diameter 218 of the transmitter coil 216. In embodiments, each of the plurality of hook shaped coils 228*a* of the first receiving coil 224 are symmetric in shape. In other embodiments, the any of the plurality of hook shaped coils 228*a* of the first receiving coil 224 are not symmetric.

Connection junctions 234*c* may be disposed at an end of each shank portion 290*a* of the plurality of hook shaped coils 228*a* of the first receiving coil 224. In some embodiments, each of the connection junctions 234*c* at each shank portion 290*a* may generally be an L-shaped extension, a linear extension, a curvilinear extension, and/or the like and generally extend from the shank portion 290*a* in a direction offset or bent with respect to the shank portion 290*a*. It should be appreciated that in some embodiments the L-shaped extension, the linear extension, the curvilinear extension, and/or the like of the connection junctions 234*c* may be uniform and symmetrically. In other embodiments the L-shaped extension, the linear extension, the curvilinear extension, and/or the like of the connection junctions 234*c* may be irregular and unsymmetrically (i.e., not uniform). It should be appreciated that the number of connection junctions 234*c* may depend on the number of coils, and, as such, embodiments described herein are non-limiting examples thereof.

Connection junctions 234*a* may be disposed at an end of each point portion 296*a* of the plurality of hook shaped coils 228*a* of the first receiving coil 224. In some embodiments, each of the connection junctions 234*a* at each point portion 296*a* may be at the distal end of the L-shaped extension, the linear extension, the curvilinear extension, and/or the like of the point portion 296*a* so to generally extend in a direction away from the transmitter coil 116. It should be appreciated that the number of connection junctions 234*a* may depend on the number of coils, and, as such, embodiments described herein are non-limiting examples thereof.

In embodiments, each of the connection junctions 234a at the point portion 296a and the connection junctions 234c at the shank portion 290a may be arranged such that the connection junctions 234a, 234c are positioned or angled towards the central region 232. In some embodiments, the plurality of hook shaped coils 228a of the first receiving coil 224 further include additional or supplemental connection junctions 234b disposed along the shank portion 290a and/or the throat portion 292a. It should be appreciated that the additional or supplemental connection junctions 234b may be disposed along anywhere on the plurality of hook shaped coils 228a. The connection junctions 234b may be disposed at a point of a hook portion 240. The hook portion 240 may hook or bend towards and/or away from the central region 232.

The second receiving coil 226 may include a plurality of hook shaped coils 228b. In embodiments, the plurality of hook shaped coils 228b tangentially extend radially outward from the central region 232 of the two-part receiving coil 222 towards the transmitter coil 216. Each hook of the plurality of hook shaped coils 228b includes a shank portion 290b, a throat portion 292b, a bend portion 294b, and a point portion 296b. The shank portion 290b extends radially from the central region 232 of the two-part receiving coil 222. The throat portion 292b may be partially or fully arcuate or curvilinear. The point portion 296b extends radially from the bend portion 294b at the transmitter coil 216 in a direction away from the transmitter coil 216 and towards the central region 232 of the two-part receiving coil 222. In general, it is appreciated that each of the hook shaped coils of the plurality of hook shaped coils 228b begins by extending radially outward from a position near the central axis 268 and ends at a position near the transmitter coil 216 and has a generally arcuate or curvilinear portion between the beginning and ending of the coil. In some embodiments, the point portion 296b is an L-shaped extension, a linear extension, a curvilinear extension, and/or the like and may be uniform and symmetric. In other embodiments the L-shaped extension, the linear extension, the curvilinear extension, and/or the like of the point portion 296b is irregular and unsymmetrical (i.e., not uniform). It should be appreciated that each bend portion 294b may define the outer region or circumference of the second receiving coil 226. The circumference or outer region may be adjacent to or overlap a portion of the inner diameter 218 of the transmitter coil 216. That is, it is appreciated that the bend portion 294b and/or a portion of the throat portion 292b may partially or fully overlap or underlap a portion of the inner diameter 218 of the transmitter coil 216. In embodiments, each of the plurality of hook shaped coils 228b of the second receiving coil 226 are symmetric in shape. In other embodiments, any of the plurality of hook shaped coils 228b of the second receiving coil 226 are not symmetric.

Connection junctions 242c may be disposed at an end of each shank portion 290b of the plurality of hook shaped coils 228b of the second receiving coil 226. In some embodiments, each of the connection junctions 234c at each shank portion 290b may generally be an L-shaped extension, a linear extension, a curvilinear extension, and/or the like and generally extend from the shank portion 290b in a direction offset or bent with respect to the shank portion 290b. It should be appreciated that in some embodiments the L-shaped extension, the linear extension, the curvilinear extension, and/or the like of the connection junctions 242c may be uniform and symmetric. In other embodiments the L-shaped extension, the linear extension, the curvilinear extension, and/or the like of the connection junctions 242c may be irregular and unsymmetrical (i.e., not uniform). It should be appreciated that the number of connection junctions 234c may depend on the number of coils, and, as such, embodiments described herein are non-limiting examples thereof.

Connection junctions 242a may be disposed at an end of each point portion 296b of the plurality of hook shaped coils 228b of the second receiving coil 226. In some embodiments, each of the connection junctions 242a at each point portion 296b may be at the distal end of the L-shaped extension, the linear extension, the curvilinear extension, and/or the like of the point portion 296b so to generally extend in a direction away from the transmitter coil 216. It should be appreciated that the number of connection junctions 242a may depend on the number of coils, and, as such, embodiments described herein are non-limiting examples thereof.

In embodiments, each of the connection junctions 242a at the point portion 296b and the connection junctions 242c at the shank portion 290b may be arranged such that the connection junctions 242a, 242c are positioned or angled towards the central region 232. In some embodiments, the plurality of hook shaped coils 228b of the second receiving coil 226 further include additional or supplemental connection junctions 242b disposed along the shank portion 290b and/or the throat portion 292b. It should be appreciated that the additional or supplemental connection junctions 242b may be disposed along anywhere on the plurality of hook shaped coils 228b. The connection junctions 242b may be disposed at a point of a curved portion 248. The curved portion 248 may hook or bend towards and/or away from the central region 232.

It should be appreciated that the connection junctions 234c of the plurality of hook shaped coils 228a of the first receiving coil 224 and connection junctions 242c of the plurality of hook shaped coils 228b of the second receiving coil 226 align in an axial direction or in the vertical direction (i.e., in the +/−Z-direction) so to communicatively couple to one another. In embodiments, the coupling of the connection junctions 234c and the connection junctions 242c define a circumference of the central region 232. Further, in embodiments, each of the plurality of hook shaped coils 228a and each of plurality of hook shaped coils 228b are more radiused, have a constant radius, more angled, and the like with respect to the central region 232 when compared to each of the plurality of hook shaped coils 128a (FIG. 3D) and each of plurality of hook shaped coils 128b (FIG. 3E) of the sensor assembly 110 (FIG. 3B). In embodiments, the angle of each of the plurality of hook shaped coils 228a and each of plurality of hook shaped coils 228b with respect to the central region 232 is an acute angle. In other embodiments, the angle of each of the plurality of hook shaped coils 228a and each of plurality of hook shaped coils 228b with respect to the central region 232 is an obtuse angle.

In some embodiments, each of the plurality of hook shaped coils 228a and each of plurality of hook shaped coils 228b are a pair of coils, traces, and the like. In other embodiments, each of the plurality of hook shaped coils 228a and each of the plurality of hook shaped coils 228b are singular or have more than two coils, traces, and the like. The plurality of hook shaped coils 228a of the first receiving coil 224 and the plurality of hook shaped coils 228b of the second receiving coil 226 are oppositely wound and/or offset in opposite directions such that the coils are oppositely facing around the central region 232, as best seen in FIGS.

5C-5D. It is appreciated that the first receiving coil 224 and the second receiving coil 226 may be identically offset using the equation $$\frac{90}{N}$$

degrees where N is equal to the number of poles. As such, the plurality of hook shaped coils 228a of the first receiving coil 224 and the plurality of hook shaped coils 228b of the second receiving coil 226 are offset from one another such that the connection junctions 234a, 234b, 234c of the first receiving coil 224 align with the connection junctions 242a, 242b, 242c of the second receiving coil 226. In some embodiments, the corresponding of the connection junctions 234a, 234b, 234c of the first receiving coil 224 to the connection junctions 242a, 242b, 242c of the second receiving coil 226 permit communication and/or receiving of flux changes associated with the first end 212 of the shaft 214, as discussed in greater detail herein.

The first receiving coil 224 and the second receiving coil 226 may be positioned in different layers of the PCB 230 in the axial direction or in the vertical direction (i.e., in the +/−Z-direction) such that a difference in the distance or airgap from the first end 212 of shaft 214 is created, similar to that as described with reference to FIG. 1H with respect to the sensor assembly 10. That is, each one of the plurality of hook shaped coils 228a of first receiving coil 224 is in one layer of the PCB 230 and each one of the plurality of hook shaped coils 228b of the second receiving coil 226 are all together in a different layer of the PCB 330 from each one of the plurality of hook shaped coils 228a of first receiving coil 324. In some embodiments, the first receiving coil 224 and the second receiving coil 226 may be positioned in adjacent or adjoining layers. In other embodiments, the first receiving coil 224 and the second receiving coil 226 may be positioned in layers that are spaced apart or separated by another layer that may be unoccupied or may contain other coils (i.e. a portion of the transmitter coil and the like). It should be appreciated that the depth of the first receiving coil 124 and the depth of the second receiving coil 126 in the axial or vertical direction (i.e., in the +/−Z-direction) are selected with a relationship to the first end 112 of the shaft 114 based on a strength of the signal required for the airgap or distance.

As such, portions of the first receiving coil 224 overlap portions of the second receiving coil 226 and portions of the second receiving coil 226 under lap portions of the first receiving coil 224, as best seen in FIG. 3A-3B for this embodiment and shown in the cross-sectional view of FIG. 1H with respect to the sensor assembly 10. As such, it should be appreciated that the overlap portions are not connected with the path of the coil above and/or below, and that this coil arrangement permits sensing of the first end 212 of the shaft 214 from different distances or air gaps and permits the first receiving coil 224 and the second receiving coil 226 to act as independent coils. In yet other embodiments, portions of the first receiving coil 224 and the second receiving coil 226 are disposed within the same layer of the PCB 230 so to have the same depth in the vertical direction (i.e., in the +/−Z-direction) or airgap from the first end 212 of shaft 214.

It should also be appreciated that the plurality of hook shaped coils 228a of first receiving coil 224 and the plurality of hook shaped coils 228b of the second receiving coil 226 are depicted as each having eight coils, but this is a non-limiting example and the two-part receiving coil 222 may have more or less. In addition, it should be appreciated that there may be more hook shaped coils 228a in the first receiving coil 224 than in the second receiving coil 226, and vice versa. Further, it should be appreciated that the plurality of hook shaped coils 228a of first receiving coil 224 and the plurality of hook shaped coils 228b of the second receiving coil 226 may be coplanar with the transmitter coil 216 or may be in parallel planes with each other and/or with the transmitter coil 216

It should be appreciated that the three pole sensor assembly 200 utilizes the transmitter coil 216 as described with respect to the sensor assembly 210. In particular, with reference to FIGS. 1F-1G and FIG. 5A-5B, the transmitter coil 216 includes two parts, an upper coil 16a and a lower coil 16b interlaced between two layers of the PCB 230. Each part of the transmitter coil 216 is generally circular and extends at least the diameter of the target coupler, as discussed in greater detail herein. Further, the upper coil 16a has an inner diameter 18a and an outer diameter 20a and the lower coil 16b has an inner diameter 18b and an outer diameter 20b. The inner and outer diameters of the upper and lower coils 16a, 16b form the inner diameter 218 and outer diameter 220 of the transmitter coil 216. For brevity reasons, the remaining description of the transmitter coil 216 are omitted here and can be found in greater detail above with respect to the one pole sensor assembly 1.

Now referring back to FIGS. 5A-5D, the first end 212 of the shaft 214 will be described. The shaft 214 may be an elongated member having the first end 212 and a second end (not shown). It should be appreciated that the second end may be attached to a device (not shown) such that the second end rotates or moves (i.e., linearly, curvilinear, elliptically, and the like) about a shaft axis 213. The shaft 214 may be any material suitable for influencing—changing, modifying, and the like, the electromagnetic field or the magnetic flux and/or that makes the shaft a coupler such that the coupling may be detected by the sensor assembly 210.

Figure 5A:
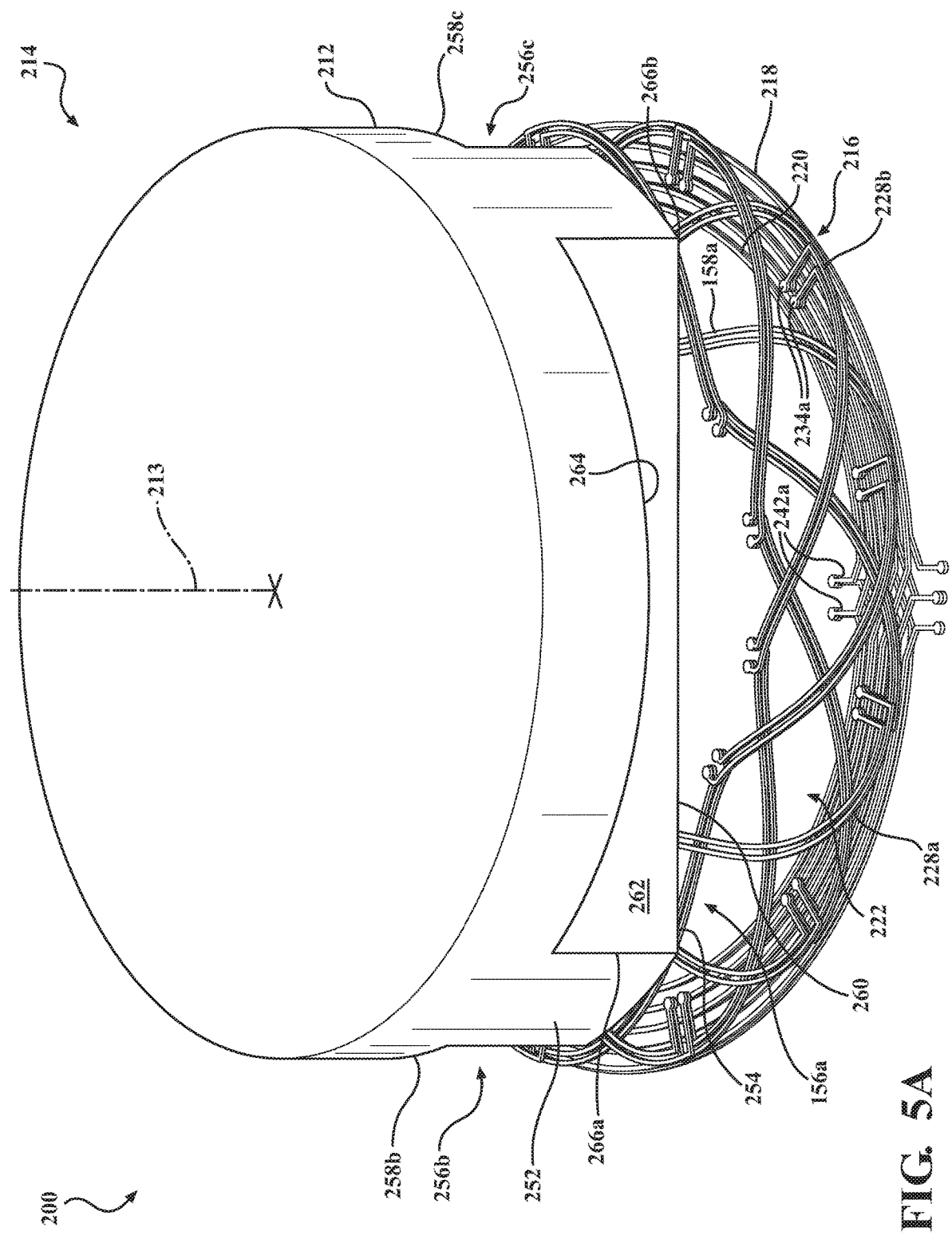
FIG. 5A schematically depicts a perspective view of a three pole sensor assembly according to one or more embodiments shown and described herein.

The first end 212 is integrally formed from the shaft 214. That is the first end 212 is the shaft 214, but incorporating geometrical differences as discussed in greater herein. As such, the first end 212 includes a cylindrical outer surface 252 and a bottom surface 254. The bottom surface 254 is planar. The cylindrical outer surface 252 may be milled, machined, and/or the like so to incorporate the geometric differences such as forming three flat portions 256a, 256b, 256c in the cylindrical outer surface 252, which creates three undercut portions 258a, 258b, 258b. That is, each flat portion 256a, 256b, 256c may be formed by removing the cylindrical outer surface 252 radially from the shaft axis 213. Each of the undercut portions 258a, 258b, 258c has a void or is missing shaft material. That is, creating the flat portions 256a, 256b, 256c in the cylindrical outer surface 252 shaves or removes a portion of the cylindrical outer surface 252 and a portion of the bottom surface 254 such that portions of the cylindrical outer surface 252 and the bottom surface 254 of the first end 212 are removed. By creating the three flat portions 256a, 256b, 256c formed in the cylindrical outer surface 252, the three undercut portions 258a, 258b, 258c are created having undercut surfaces 264a, 264b, 264c. The undercut surfaces 264a, 264b, 264c are each a second panar surface spaced apart from the bottom surface 254. The three flat portions 256a, 256b, 256c creating the three undercut portions 258a, 258b, 258c are all identical (i.e., are uniform and symmetrical in shape and size) and thus only undercut portion 258a will be described in further detail. It should be appreciated that the each undercut portions 258a, 258*b*, 258*c* may not be uniform and/or symmetrical in shape and size. The flat portion 256*a*, includes a wall 262, extending coaxially with the shaft axis 213 towards the second end (not shown) and terminating at an upper end at the undercut surface 264*a*. As best seen in FIG. 5A, the a lower end of the wall 262 terminates at the bottom surface 254, which forms a straight edge 260*a*. It should be appreciated that each of the undercut portions 258*a*, 258*b*, 258*c* has an undercut surfaces 264*a*, 264*b*, 264*c* and a straight edge 260*a*, 260*b*, 260*c* (FIG. 5B) on opposite sides. The straight edges 260*a*, 260*b*, 260*c*, are spaced apart by the bottom surface 254 and separated by the curvature of the cylindrical outer surface 252. The straight edge 260*a* extends between the cylindrical outer surface 252, which creates a pair of edges 266*a*, 266*b* of the straight edge 260*a*. The straight edges 260*a*, 260*b*, 260*c* and the bottom surface 254 are a coupler target. It should be appreciated that in some embodiments, the cylindrical outer surface 252 may be milled, machined, and/or the like such that the target coupler is reduced in size, diameter, circumference, and the like such that the pair of edges 266*a*, 266*b* of the straight edge 260*a* and/or the other straight edges 260*b*, 260*c* would be more inboard in this embodiment. The straight edge 260*a* and the cylindrical outer surface 252 may be positioned over the two-part receiving coil 222.

In operation, the first end 212 of the shaft 214 is rotated or moved about the shaft axis 213 such that the straight edge 260*a* rotates or moves at a first distance from the transmitter coil 216 and the two-part receiving coil 222. In some embodiments, the straight edge 260*a* rotates or moves about the central axis 268. In some embodiments, the straight edge 160 and the cylindrical outer surface 252 rotate within the outer diameter 220 of the transmitter coil 216. In other embodiments, a portion of the straight edge 260*a* and/or a portion of the cylindrical outer surface 252 extend beyond the outer diameter 220 or is within the inner diameter 118 of the transmitter coil 216. The rotation or movement of the straight edge 160*a* and the bottom surface 254 of the first end 212 is detected by the sensor assembly 210. On the other hand, the undercut surface 264*a* of the undercut portion 258*a*, is at a second distance from the first and the second receiving coils 224, 226 and the transmitter coil 216. The second distance is greater than the first distance in the axial or vertical direction (i.e. in the +/−Z-direction) such that the undercut surface 264*a* of the undercut portions 238*a* is not be detected by the sensor assembly 210, but the straight edge 260*a* and the bottom surface 254 are detected. It should be appreciated that the depth of the undercut portion 258*a* and the undercut surfaces 264*a*, in the axial or vertical direction (i.e., in the +/−Z-direction) is selected with a relationship to the sensor assembly 210 based on a strength of the signal required to sense or detect the straight edge 260*a* and the bottom surface 254 and not detect the undercut surface 264*a*. For example, and not by way of limitation, the depth of the undercut surface 264*a* in the vertical direction (i.e., in the +/−Z-direction), may be generally greater than 4 millimeters and distance between the bottom surface 254 including the straight edge 160*a* and the two-part receiving coil 222 may generally be between 1 millimeter to 3 millimeters. As such, only the straight edge 260*a* and/or the bottom surface 254 may be detected by the sensor assembly 210.

As such, it is appreciated that the that the geometric arrangement of the target coupler formed in the first end 212 of the shaft 214 and the sensor assembly 210 arrangement corrects a nonsinusoidal input signal to the signal processor 702. That is, the sensor assembly 210 produces a sinusoidal curve in a polar coordinate system when detecting the geometries formed into the first end 212 of the shaft 214, as discussed in greater detail herein. Further, the geometric arrangement of the target coupler formed in the first end 212 of the shaft 214 and the arrangement of the coils in the sensor assembly 210 eliminate harmonics when detecting the geometries formed into the first end 212 of the shaft 214, as discussed in greater detail herein.

With reference now to FIGS. 6A-6D, a four pole sensor assembly 300 is schematically depicted. The four pole sensor assembly 300 includes a sensor assembly 310 and a shaft 314 having a first end 312. It should be appreciated that only a portion the shaft 314 is illustrated and that the shaft 314 may be any width, diameter, radius, and/or the like. The four pole sensor assembly 300 includes a transmitter coil 316. The transmitter coil 316 is generally circular in shape and has a predetermined inner diameter 318 and a predetermined outer diameter 320. The transmitter coil 316 may be powered by an alternating current source (not shown) to produce an electromagnetic carrier flux.

The sensor assembly 310 further includes a two-part receiving coil 322. The two-part receiving coil 322 includes a first receiving coil 324, a second receiving coils 326, and a central region 332. The central region 332 further includes a central axis 368. The first receiving coil 324 may include a plurality of hook shaped coils 328*a*. In embodiments, the plurality of hook shaped coils 328*a* tangentially extend radially outward from the central region 332 of the two-part receiving coil 322 towards the transmitter coil 316. Each hook of the plurality of hook shaped coils 328*a* includes a shank portion 390*a*, a throat portion 392*a*, a bend portion 394*a*, and an inverted point portion 396*a*. The shank portion 390*a* extends radially from the central region 332 of the two-part receiving coil 322. The throat portion 392*a* may be partially or fully arcuate or curvilinear. The inverted point portion 396*a* extends radially from the bend portion 394*a* at the transmitter coil 316 in a direction away from the outer diameter 320 of the transmitter coil 316. In general, it is appreciated that each of the hook shaped coils of the plurality of hook shaped coils 328*a* begins by extending radially outward from a position near the central axis 368 and ends at a position near the transmitter coil 316 and has a generally arcuate or curvilinear portion between the beginning and ending of the coil. In some embodiments, the inverted point portion 396*a* is an L-shaped extension, a linear extension, a curvilinear extension, and/or the like and may be uniform and/or symmetrical. In other embodiments the L-shaped extension, the linear extension, the curvilinear extension, and/or the like of the inverted point portion 396*a* is irregular and/or unsymmetrical (i.e., not uniform). In embodiments, each of the plurality of hook shaped coils 328*a* of the first receiving coil 324 are symmetric in shape. In other embodiments, the any of the plurality of hook shaped coils 328*a* of the first receiving coil 324 are not symmetric.

Connection junctions 334*c* may be positioned at an end of each shank portion 390*a* of the plurality of hook shaped coils 328*a* of the first receiving coil 324. In some embodiments, each of the connection junctions 334*c* at each shank portion 390*a* may generally be an L-shaped extension, a linear extension, a curvilinear extension, and/or the like and generally extend from the shank portion 390*a* in a direction offset or bent with respect to the shank portion 390*a*. It should be appreciated that in some embodiments the L-shaped extension, the linear extension, the curvilinear extension, and/or the like of the connection junctions 334*c* may be uniform and symmetrical. In other embodiments the L-shaped extension, the linear extension, the curvilinear extension, and/or the like of the connection junctions 334*c* may be irregular and/or unsymmetrical (i.e., not uniform). It should be appreciated that the number of connection junctions 334c may depend on the number of coils, and, as such, embodiments described herein are non-limiting examples thereof.

Connection junctions 334a may be disposed at an end of each inverted point portion 396a of the plurality of hook shaped coils 328a of the first receiving coil 324. In some embodiments, each of the connection junctions 334a at each inverted point portion 396a may be at the distal end of the L-shaped extension, the linear extension, the curvilinear extension, and/or the like of the inverted point portion 396a so to generally extend in a direction away from the transmitter coil 316. It should be appreciated that the number of connection junctions 334a may depend on the number of coils, and, as such, embodiments described herein are non-limiting examples thereof. It should be appreciated that of the connection junctions 334a of the inverted point portion 396a may define the outer region or circumference of the first receiving coil 324. The circumference or outer region may extend beyond the outer diameter 320 of the transmitter coil 316. That is, it is appreciated that the connection junctions 334a and/or a portion of the inverted point portion 396a may partially or fully extend beyond the outer diameter 320 of the transmitter coil 316.

In embodiments, each of the connection junctions 334a at the inverted point portion 396a may be arranged such that the connection junctions 334a are positioned or angled away from the central region 232 and the connection junctions 334c at the shank portion 390a may be arranged such that the connection junctions 334c are positioned or angled towards the central region 232. In some embodiments, the plurality of hook shaped coils 328a of the first receiving coil 324 further include additional or supplemental connection junctions 334b disposed along the shank portion 390a and/or the throat portion 392a. It should be appreciated that the additional or supplemental connection junctions 334b may be disposed along anywhere on the plurality of hook shaped coils 328a. The connection junctions 342b may be disposed at a point of a curved portion 340. The curved portion 340 may hook or bend towards and/or away from the central region 332.

In some embodiments, each of the connection junctions 334c at each shank portion 390b may generally be an L-shaped extension, a linear extension, a curvilinear extension, and/or the like and generally extend from the shank portion 390a in a direction offset or bent with respect to the shank portion 390a.

The second receiving coil 326 may include a plurality of hook shaped coils 328b. In embodiments, the plurality of hook shaped coils 328b tangentially extend radially outward from the central region 332 of the two-part receiving coil 322 towards the transmitter coil 316. Each hook of the plurality of hook shaped coils 328b includes a shank portion 390b, a throat portion 392b, a bend portion 394b, and an inverted point portion 396b. The shank portion 390b extends radially from the central region 332 of the two-part receiving coil 322. The throat portion 392b may be partially or fully arcuate or curvilinear. The inverted point portion 396b extends radially at the transmitter coil 316 in a direction away from the outer diameter 320 of the transmitter coil 316. In general, it is appreciated that each of the hook shaped coils of the plurality of hook shaped coils 328b begins by extending radially outward from a position near the central axis 368 and ends at a position near the transmitter coil 316 and has a generally arcuate or curvilinear portion between the beginning and ending of the coil. In some embodiments, the inverted point portion 396b is an L-shaped extension, a linear extension, a curvilinear extension, and/or the like and may be uniform and/or symmetrical. In other embodiments the L-shaped extension, the linear extension, the curvilinear extension, and/or the like of the inverted point portion 396b is irregular and unsymmetrical (i.e., not uniform). In embodiments, each of the plurality of hook shaped coils 328b of the second receiving coil 326 are symmetric in shape. In other embodiments, any of the plurality of hook shaped coils 328b of the second receiving coil 326 are not symmetric.

Connection junctions 342c may be positioned at an end of each shank portion 390b of the plurality of hook shaped coils 328b of the second receiving coil 326. In some embodiments, each of the connection junctions 342c at each shank portion 390b may generally be an L-shaped extension, a linear extension, a curvilinear extension, and/or the like and generally extend from the shank portion 390b in a direction offset or bent with respect to the shank portion 390b. It should be appreciated that in some embodiments the L-shaped extension, the linear extension, the curvilinear extension, and/or the like of the connection junctions 342c may be uniform and/or symmetrical. In other embodiments the L-shaped extension, the linear extension, the curvilinear extension, and/or the like of the connection junctions 342c may be irregular and/or unsymmetrical (i.e., not uniform). It should be appreciated that the number of connection junctions 342c may depend on the number of coils, and, as such, embodiments described herein are non-limiting examples thereof.

Connection junctions 342a may be disposed at an end of each inverted point portion 396b of the plurality of hook shaped coils 328b of the second receiving coil 326. In some embodiments, each of the connection junctions 342a at each inverted point portion 396b may be at the distal end of the L-shaped extension, the linear extension, the curvilinear extension, and/or the like of the inverted point portion 396b so to generally extend in a direction away from the transmitter coil 316. It should be appreciated that the number of connection junctions 342a may depend on the number of coils, and, as such, embodiments described herein are non-limiting examples thereof. It should be appreciated that of the connection junctions 342a of the inverted point portion 396b may define the outer region or circumference of the first receiving coil 324. The circumference or outer region may extend beyond the outer diameter 320 of the transmitter coil 316. That is, it is appreciated that the connection junctions 342a and/or a portion of the inverted point portion 396b may partially or fully extend beyond the outer diameter 320 of the transmitter coil 316.

In embodiments, each of the connection junctions 342a at the inverted point portion 396b may be arranged such that the connection junctions 342a are positioned or angled away from the central region 232 and the connection junctions 342c at the shank portion 390b may be arranged such that the connection junctions 342c are positioned or angled towards the central region 232. In some embodiments, the plurality of hook shaped coils 328b of the second receiving coil 326 further include additional or supplemental connection junctions 342b disposed along the shank portion 390b and/or the throat portion 392b. It should be appreciated that the additional or supplemental connection junctions 342b may be disposed along anywhere on the plurality of hook shaped coils 328b. The connection junctions 342b may be disposed at a point of a curved portion 348. The curved portion 348 may hook or bend towards and/or away from the central region 332.

In some embodiments, each of the connection junctions 342c at each shank portion 390b may generally be an L-shaped extension, a linear extension, a curvilinear extension, and/or the like and generally extend from the shank portion 390b in a direction offset or bent with respect to the shank portion 390b such that the connection junctions.

Figure 5B:
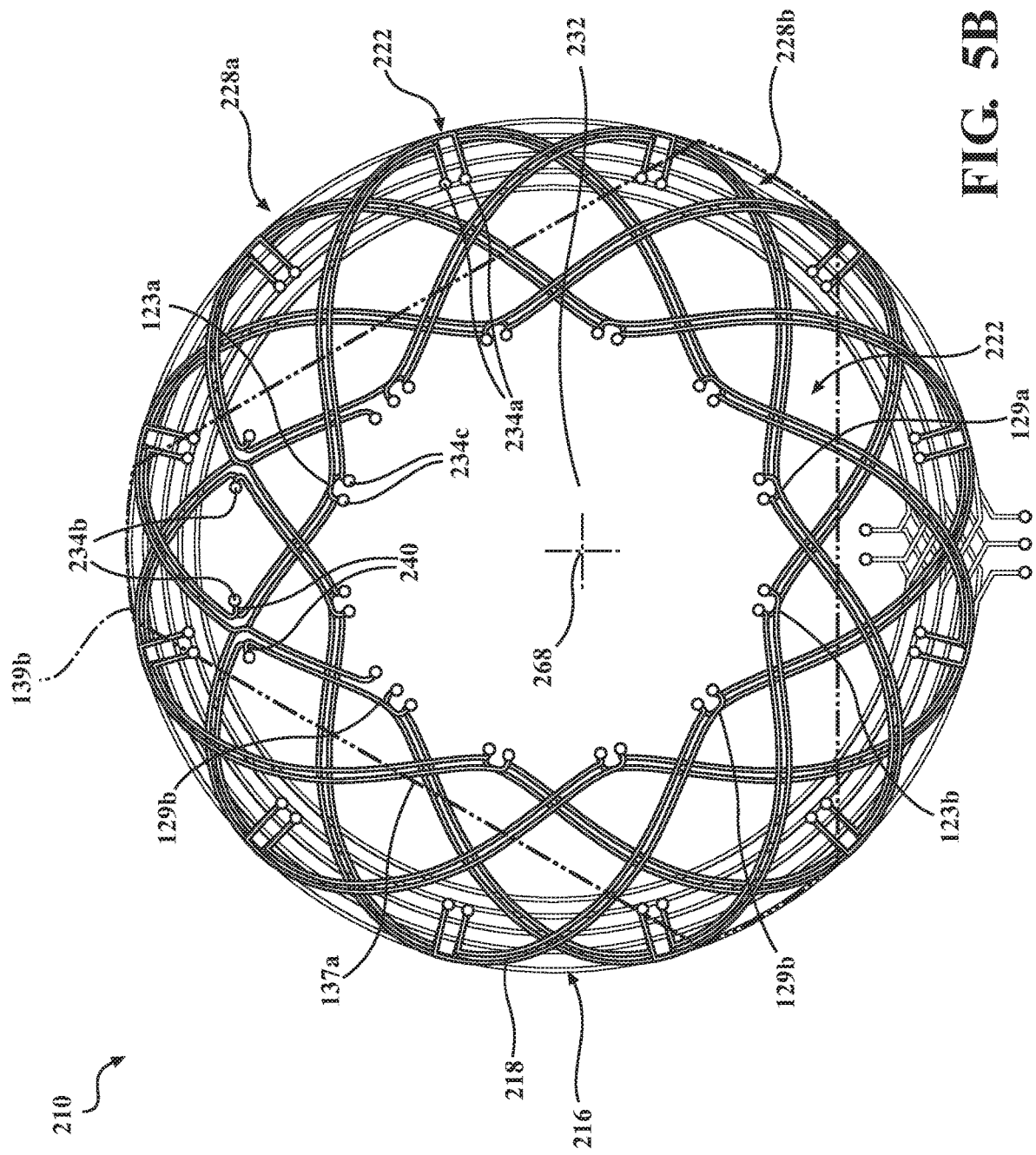
FIG. 5B schematically depicts a top view of the sensor assembly of FIG. 5A highlighting a coupler element in communication with a sensor according to one or more embodiments shown and described herein.
Figure 5D:
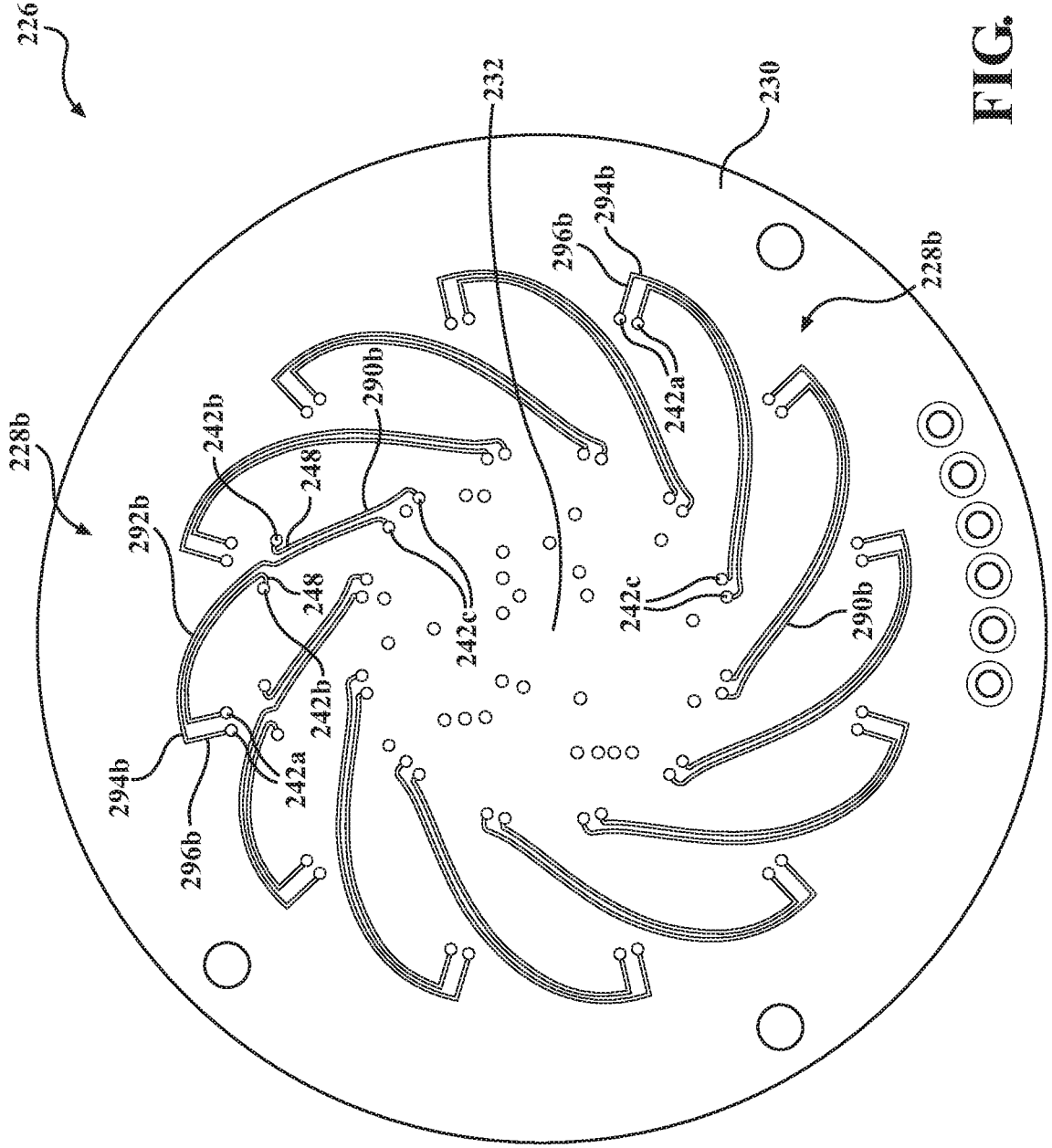
FIG. 5D schematically depicts an isolated top view of a second receiving coil of the sensor assembly of FIG. 5A according to one or more embodiments shown and described herein.

It should be appreciated that the connection junctions 334c of the plurality of hook shaped coils 328a of the first receiving coil 324 and connection junctions 342c of the plurality of hook shaped coils 328b of the second receiving coil 326 align in an axial direction or in the vertical direction (i.e., in the +/−Z-direction) so to communicatively couple to one another. In embodiments, the coupling of the connection junctions 334c and the connection junctions 342c define a circumference of the central region 332. Further, it is appreciated that the connection junctions 334c and the connection junctions 342c terminate together, symmetrically and an equal distance radially from the central axis 368. As such, the connection junctions 334c and connection junctions 342c form a uniform circumference or circular shape for the central region 332. It is also appreciated that the uniform circumference of the central region 332 formed from the terminating of the connection junctions 334c and connection junctions 342c is more defined than that of the sensor assembly 10 (FIG. 1B), the sensor assembly 110 (FIG. 3B), and the sensor assembly 210 (FIG. 5B).

In some embodiments, each of the plurality of hook shaped coils 328a and each of plurality of hook shaped coils 328b are a pair of coils, traces, and the like. In other embodiments, each of the plurality of hook shaped coils 328a and each of the plurality of hook shaped coils 328b are singular or have more than two coils, traces, and the like. The plurality of hook shaped coils 328a of the first receiving coil 324 and the plurality of hook shaped coils 328b of the second receiving coil 326 are oppositely wound and/or offset in opposite directions such that the coils are oppositely facing around the central region 332, as best seen in FIGS. 6C-6D. It is appreciated that the first receiving coil 324 and the second receiving coil 326 may be identically offset using the equation $$\frac{90}{N}$$

degrees where N is equal to the number of poles. As such, the plurality of hook shaped coils 328a of the first receiving coil 324 and the plurality of hook shaped coils 328b of the second receiving coil 326 are offset from one another such that the connection junctions 334a, 334b, 334c of the first receiving coil 324 align with the connection junctions 342a, 342b, 342c of the second receiving coil 326. In some embodiments, the corresponding of the connection junctions 334a, 334b, 334c of the first receiving coil 324 to the connection junctions 342a, 342b, 342c of the second receiving coil 326 permit communication and/or receiving of flux changes associated with the first end 312 of the shaft 314, as discussed in greater detail herein.

The first receiving coil 324 and the second receiving coils 326 may be positioned in different layers of the PCB 330 in the axial direction or in the vertical direction (i.e., in the +/−Z-direction) such that a difference in the distance or airgap from the first end 312 of shaft 314 is created, similar to that as described with respect to FIG. 1H and the sensor assembly 10. That is, each one of the plurality of hook shaped coils 328a of first receiving coil 324 is in one layer of the PCB 330 and each one of the plurality of hook shaped coils 328b of the second receiving coil 326 are all together in a different layer of the PCB 330 from each one of the plurality of hook shaped coils 328a of first receiving coil 324. In some embodiments, the first receiving coil 324 and the second receiving coils 326 may be positioned in adjacent or adjoining layers. In other embodiments, the first receiving coil 324 and the second receiving coils 326 may be positioned in layers that are spaced apart or separated by another layer that may be blank or may contain other coils (i.e. a portion of the transmitter coil and the like). It should be appreciated that the depth of the first receiving coil 324 and the depth of the second receiving coil 326 in the axial or vertical direction (i.e., in the +/−Z-direction) are selected with a relationship to the first end 312 of the shaft 314 based on a strength of the signal required for the airgap or distance.

Figure 6A:
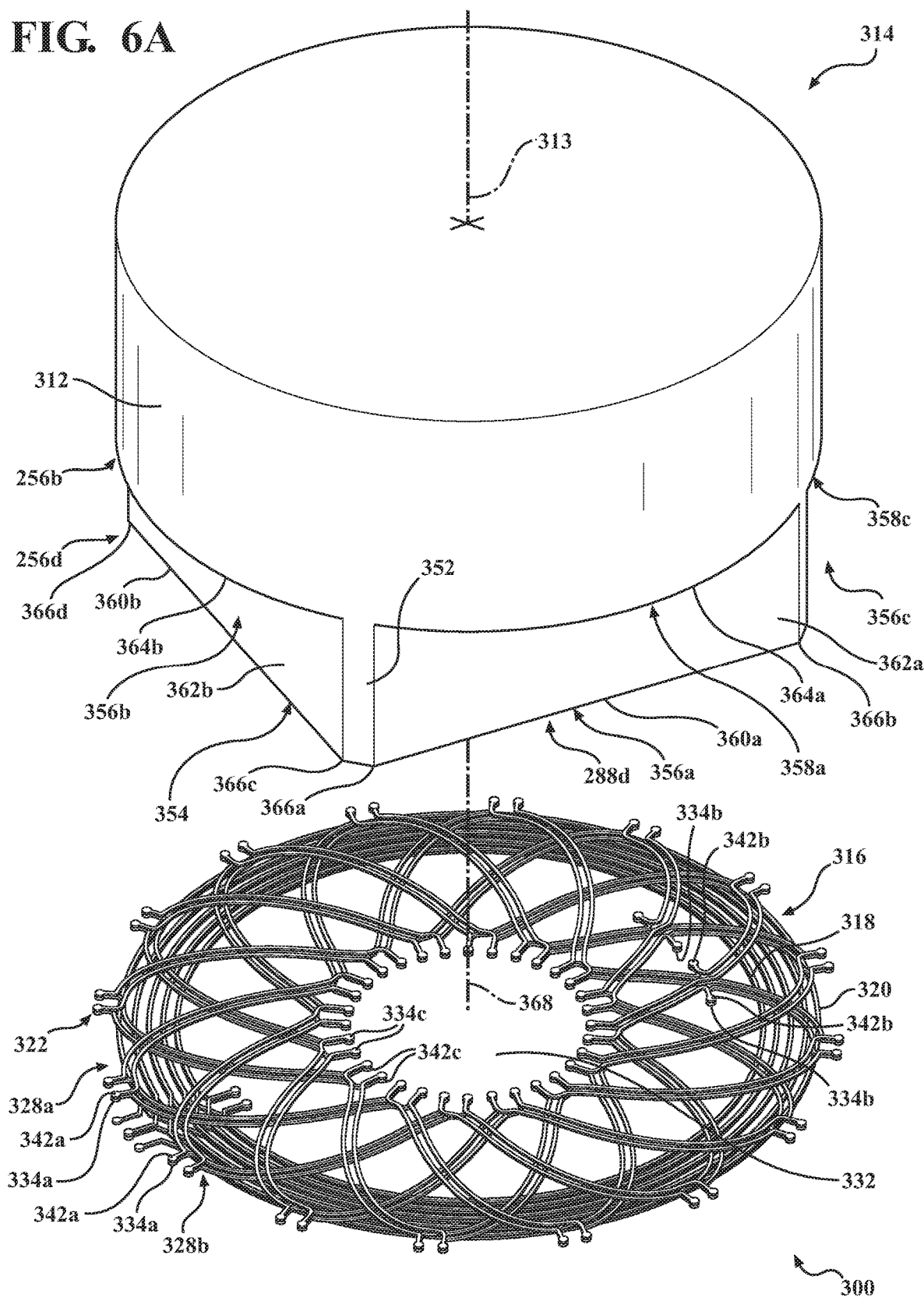
FIG. 6A schematically depicts a perspective view of a four pole sensor assembly according to one or more embodiments shown and described herein.
Figure 6B:
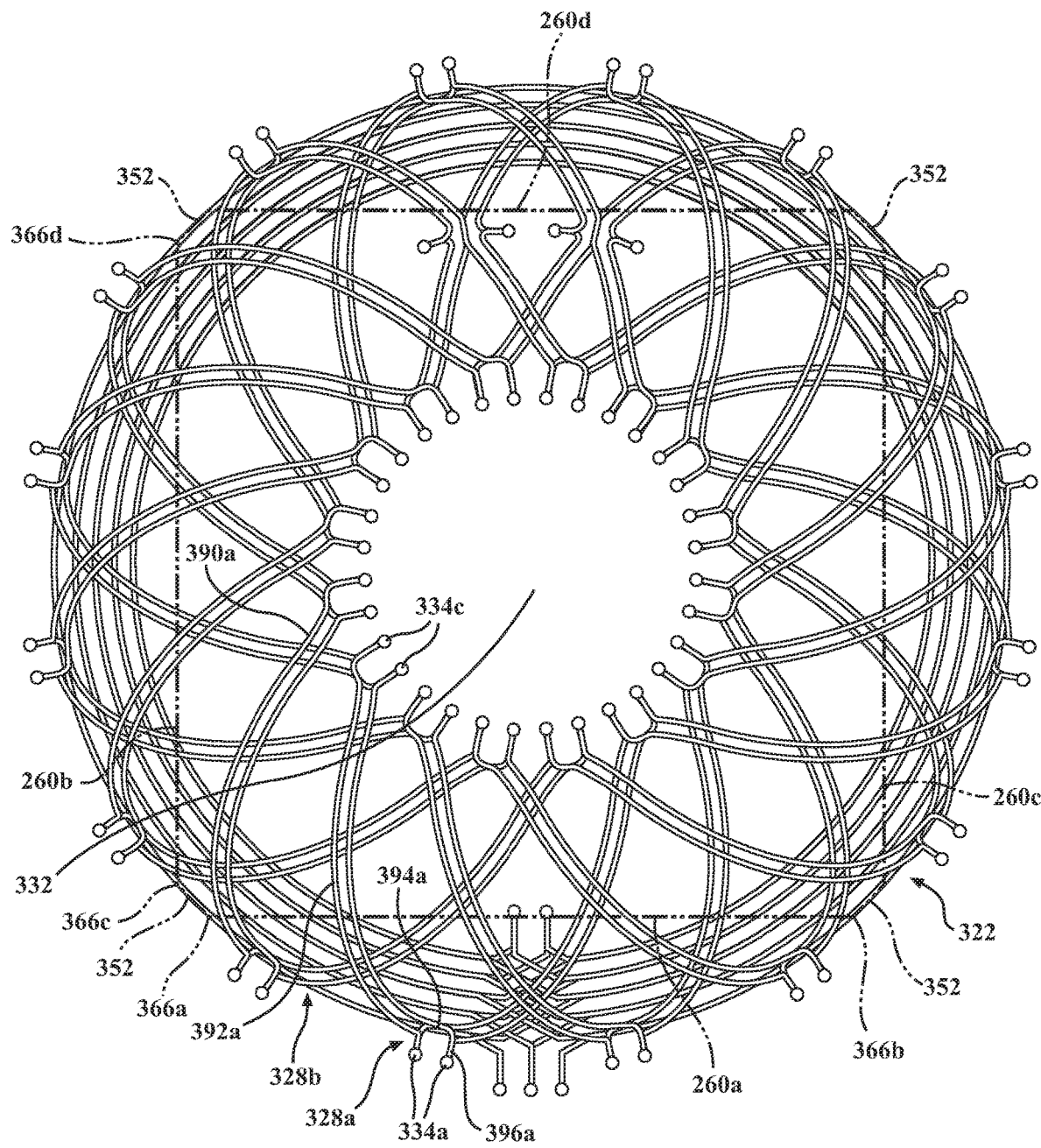
FIG. 6B schematically depicts a top view of the sensor assembly of FIG. 6A highlighting a coupler element in communication with a sensor according to one or more embodiments shown and described herein.
Figure 6C:
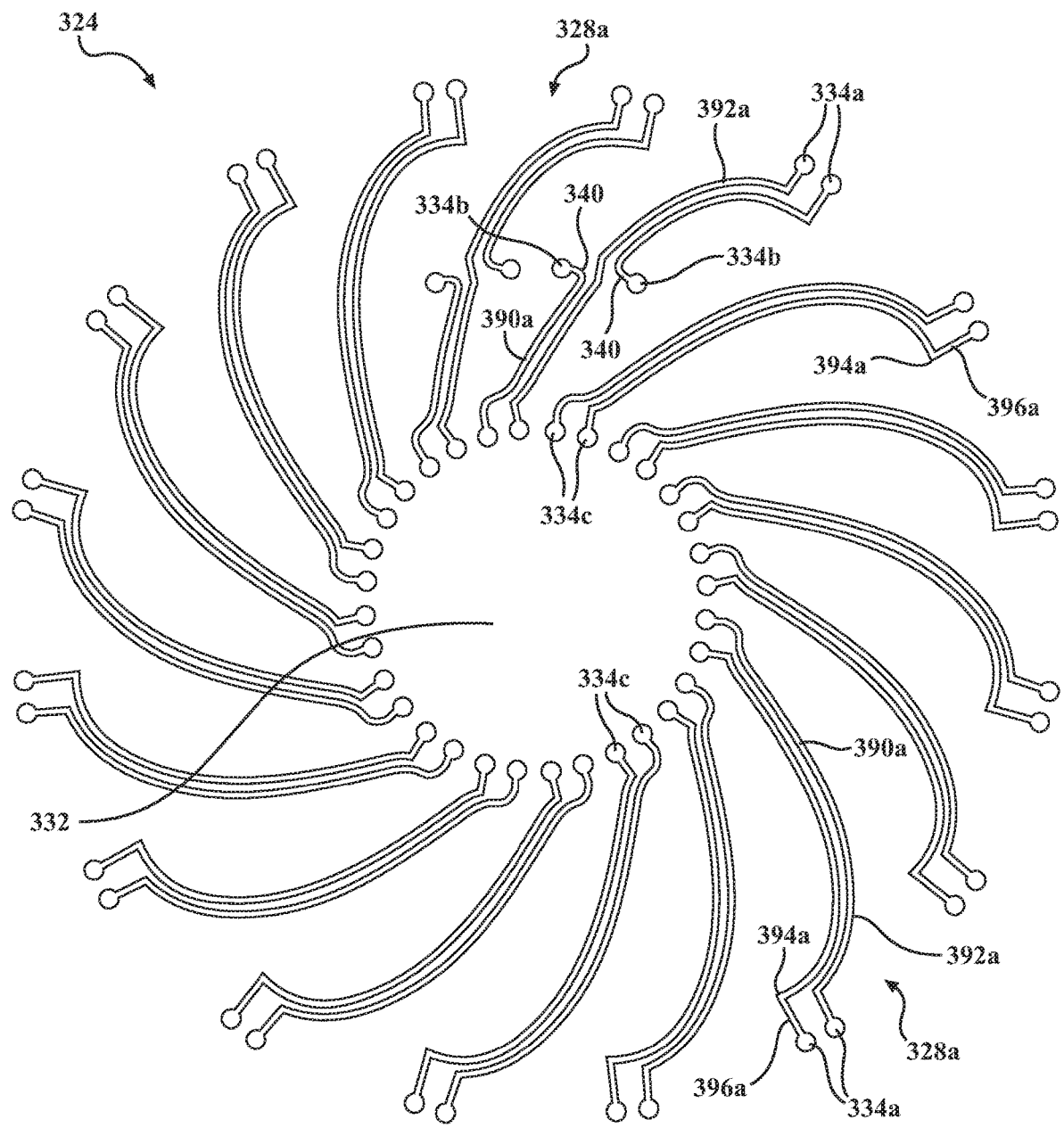
FIG. 6C schematically depicts an isolated top view of a first receiving coil of the sensor assembly of FIG. 6A according to one or more embodiments shown and described herein.
Figure 6D:
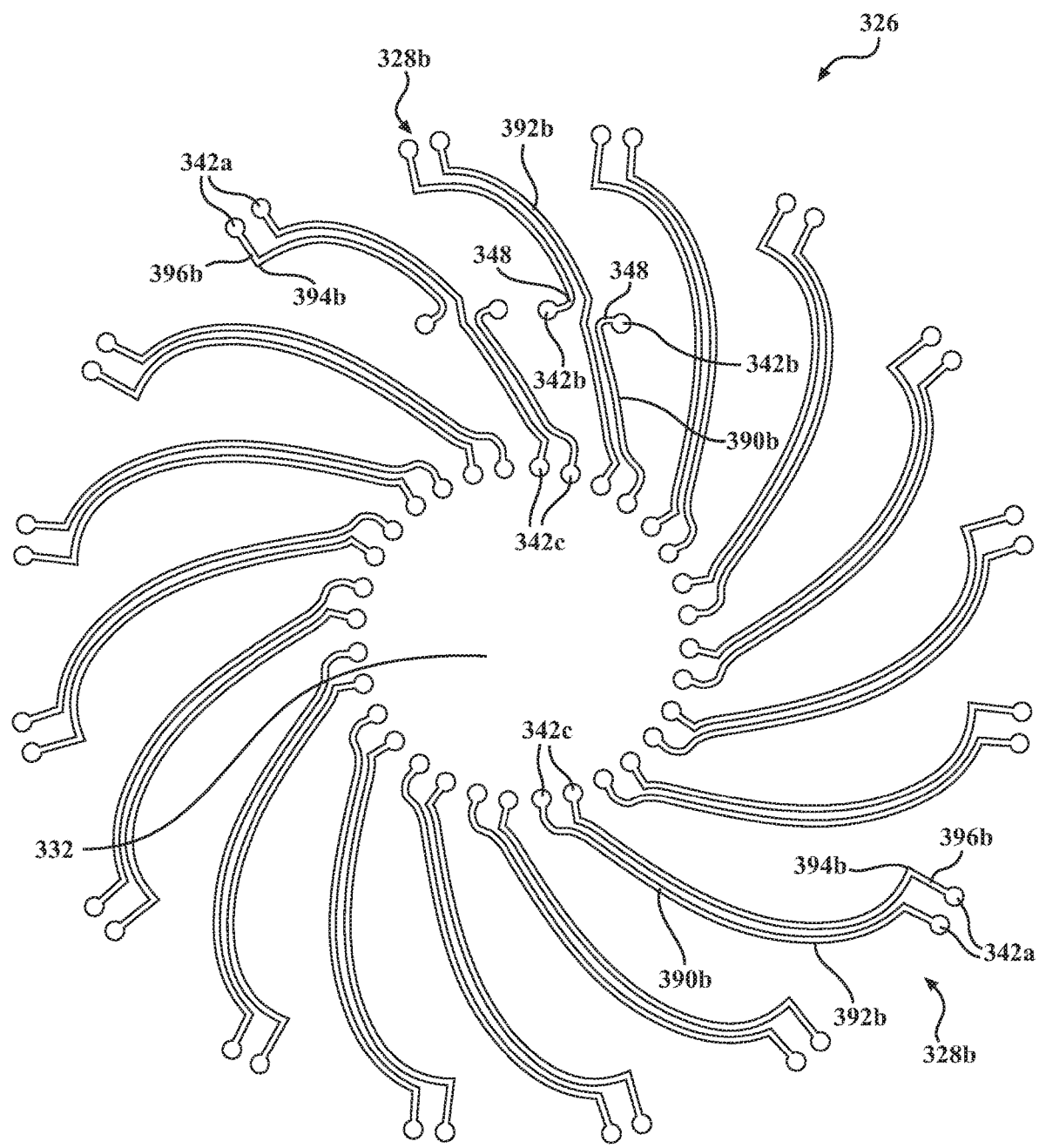
FIG. 6D schematically depicts an isolated top view of a second receiving coil of the sensor assembly of FIG. 6A according to one or more embodiments shown and described herein.

As such, portions of the first receiving coil 324 overlap portions of the second receiving coils 326 and portions of the second receiving coils 326 under lap portions of the first receiving coil 324, as best seen in FIG. 6A-6B for this embodiment and shown in the cross-sectional view of FIG. 1H with respect to the sensor assembly 10. As such, it should be appreciated that the overlap portions are not connected with the path of the coil above and/or below, and that this coil arrangement permits sensing of the first end 312 of the shaft 314 from different distances or air gaps and permits the first receiving coil 324 and the second receiving coil 326 to act as independent coils. In yet other embodiments, portions of the first receiving coil 324 and the second receiving coils 326 are disposed within the same layer of the PCB 330 so to have the same depth in the vertical direction (i.e., in the +/−Z-direction) of airgap from the first end 312 of shaft 314.

It should also be appreciated that the plurality of hook shaped coils 328a of first receiving coil 324 and the plurality of hook shaped coils 328b of the second receiving coil 326 are depicted as each having twelve coils, but this is a non-limiting example and the two-part receiving coil 322 may have more or less. In addition, it should be appreciated that there may be more hook shaped coils 328a in the first receiving coil 324 than in the second receiving coil 326, and vice versa. Further, it should be appreciated that the plurality of hook shaped coils 328a of first receiving coil 324 and the plurality of hook shaped coils 328b of the second receiving coil 326 may be coplanar with the transmitter coil 316 or may be in parallel planes with each other and/or with the transmitter coil 316.

It should be appreciated that the four pole sensor assembly 300 utilizes the transmitter coil 316 as described with respect to the sensor assembly 310. In particular, with reference to FIGS. 1F-1G and FIG. 6A-6B, the transmitter coil 316 includes two parts, an upper coil 16a and a lower coil 16b interlaced between two layers of the PCB 330. Each part of the transmitter coil 316 is generally circular and extends at least the diameter of the target coupler, as discussed in greater detail herein. Further, the upper coil 16a has an inner diameter 18a and an outer diameter 20a and the lower coil 16b has an inner diameter 18b and an outer diameter 20b. The inner and outer diameters of the upper and lower coils 16a, 16b form the inner diameter 318 and outer diameter 320 of the transmitter coil 316. For brevity reasons, the remaining description of the transmitter coil 316 are omitted here and can be found in greater detail above with respect to the one pole sensor assembly 1.

Now referring back to FIGS. 6A-6D, the first end 312 of the shaft 314 will be described. The shaft 314 may be an elongated member having the first end 312 and a second end (not shown). It should be appreciated that the second end may be attached to a device (not shown) such that the second end rotates or moves (i.e., linearly, curvilinear, elliptically, and the like) about a shaft axis 313. The shaft 314 may be any material suitable for influencing, changing, modifying, and the like, the electromagnetic field or the magnetic flux and/or that makes the shaft a coupler such that the coupling may be detected by the sensor assembly 310.

The first end 312 is integrally formed from the shaft 314. That is the first end 312 is the shaft 314, but incorporating geometrical differences as discussed in greater herein. As such, the first end 312 includes a cylindrical outer surface 352 and a bottom surface 354. The bottom surface 354 is planar. The cylindrical outer surface 352 may be milled, machined, and/or the like so to incorporate the geometric differences such as forming four flat portions 356a, 356b, 356c, 356d in the cylindrical outer surface 352, which creates four undercut portions 358a, 358b, 358b, 358d. That is, each flat portion 356a, 356b, 356c, 356d may be formed by removing the cylindrical outer surface 352 radially from the shaft axis 313. Each of the undercut portions 358a, 358b, 358c, 358d has a void or is missing shaft material. That is, creating the flat portions 356a, 356b, 356c, 356d in the cylindrical outer surface 352 shaves or removes a portion of the cylindrical outer surface 352 and a portion of the bottom surface 354 such that portions of the cylindrical outer surface 352 and the bottom surface 354 of the first end 312 are removed. By creating the four flat portions 356a, 356b, 356c, 356d formed in the cylindrical outer surface 352 the four undercut portions 358a, 358b, 358c, 358d are are created having undercut surfaces 364a, 364b, 364c, 364d. The undercut surfaces 364a, 364b, 364c, 464d are each a second planar surface spaced apart from the bottom surface 354. The undercuts 358a, 358b, 358c, 358d are identical (i.e., are uniform and/or symmetrical in shape and size) and thus only undercut portions 358a, 358b will be described in further detail. It should be appreciated that the each of the undercut portions 358a, 358b, 358c, 358d may not be uniform and/or symmetrical in shape and size. The flat portions 356a, 356b each include a wall 362a, 362b extending coaxially with the shaft axis 313 towards the second end (not shown) and each terminating at an upper end at each respective undercut surface 364a, 364b. As best seen in FIG. 6A, a lower end of each wall 362a, 362b terminates at the bottom surface 354, which forms straight edges 360a, 360b. It should be appreciated that each of the undercut portions 358a, 358b, 358c, 358d has a straight edge 360a, 360b, 360c, 360d (FIG. 6B) on opposite sides and spaced apart by the bottom surface 354 and separated by the curvature of the cylindrical outer surface 352. The straight edges 360a, 360b extend between the cylindrical outer surface 352, which creates a pair of edges 366a, 366b of the straight edge 360a and a pair of edges 366c, 366d of the straight edge 360b. The straight edges 360a, 360b, 360c, 360d and the bottom surface 354 are a coupler target. It should be appreciated that in some embodiments, the cylindrical outer surface 352 may be milled, machined, and/or the like such that the target coupler is reduced in size, diameter, circumference, and the like such that the pair of edges 366a, 366b of the straight edge 360a, the pair of edges 366c, 366d of the straight edge 360b and/or the other straight edges 360c, 360d would be more inboard in this embodiment. The straight edges 360a, 360b, 360c, 360d, the bottom surface 354 and the cylindrical outer surface 352 may be positioned over the two-part receiving coil 322.

In operation, the first end 312 of the shaft 314 is rotated or moved about the shaft axis 313 such that the straight edges 360a, 360b, 360c, 360d rotates or moves at a first distance from the transmitter coil 316 and the two-part receiving coil 322. In some embodiments, the straight edges 360a, 360b, 360c, 360d, the bottom surface 354 and the cylindrical outer surface 352 may be positioned over the two-part receiving coil 322 and rotate or move about the shaft axis 313. In other embodiments, the straight edges 360a, 360b, 360c, 360d, the bottom surface 354 and the cylindrical outer surface 352 rotate within the outer diameter 320 of the transmitter coil 316. In other embodiments, a portion of the straight edges 360a, 360b, 360c, 360d and/or a portion of the cylindrical outer surface 352 extend beyond the outer diameter 320 of the transmitter coil 316 or is within the inner diameter 318 of the transmitter coil 316. The rotation or movement of the straight edges 360a, 360b, 360c, 360d and the bottom surface 354 of the first end 312 is detected by the sensor assembly 310. On the other hand, the undercut surfaces 364a, 364b of the undercut portions 358a, 358b, is at a second distance from the first and the second receiving coils 324, 326 and the transmitter coil 316. The second distance is greater than the first distance in the axial direction or vertical direction (i.e. in the +/−Z-direction) such that the undercut surfaces 364a, 364b of the undercut portions 358a, 358b are not be detected by the sensor assembly 310, but the straight edges 360a, 360b 360c, 360d and the bottom surface 354 are detected. It should be appreciated that the depth of the undercut portions 358a, 358b and the undercut surfaces 364a, 364b in the axial or vertical direction (i.e., in the +/−Z-direction) is selected with a relationship to the sensor assembly 310 based on a strength of the signal required to sense or detect the straight edges 360a, 360b and the bottom surface 354 and not detect the undercut surfaces 364a, 364b. For example, and not by way of limitation, the depth of the undercut surfaces 364a, 364b, 364c, 364d in the vertical direction (i.e. in the +/−Z-direction) may be generally greater than 4 millimeters and distance between the bottom surface 354 including the straight edges 360a, 360b, 360c, 360d and the sensor assembly 310 may generally be between 1 millimeter to 3 millimeters. As such, only the straight edges 360a, 360b, 360c, 360d and/or the bottom surface 354 may be detected by the sensor assembly 310.

As such, it is appreciated that the that the geometric arrangement of the target coupler formed in the first end 312 of the shaft 314 and the sensor assembly 310 arrangement corrects a nonsinusoidal input signal to the signal processor 702. That is, the sensor assembly 310 produces a sinusoidal curve in a polar coordinate system when detecting the geometries formed into the first end 312 of the shaft 314, as discussed in greater detail herein. Further, the geometric arrangement of the target coupler formed in the first end 312 of the shaft 314 and the arrangement of the coils in the sensor assembly 310 eliminate harmonics when detecting the geometries formed into the first end 312 of the shaft 314, as discussed in greater detail herein.

Figure 8:
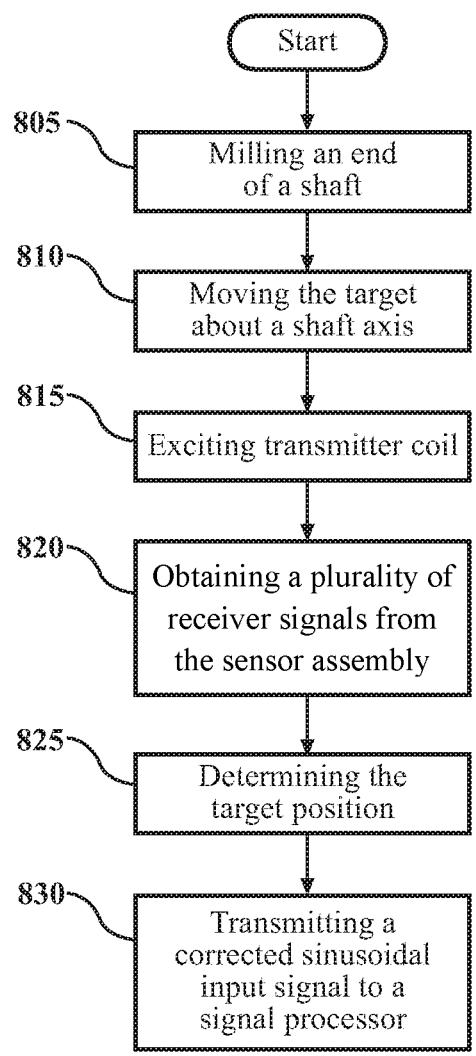
FIG. 8 schematically depicts an illustrative method 800 of determining a position of a movable shaft according to one or more embodiments shown and described herein.

Now back to FIGS. 1A-1C and now referring to FIG. 8, an illustrative method 800 of determining a position of a movable shaft is provided. It should be appreciated that the method 800 may be described below with reference to the one pole sensor assembly 1, although the method may apply to at least each embodiment as described herein.

At block 805, the first end 12 of the shaft 14 is milled to form a target. The target has a first planar surface forming the straight edge 66 and an undercut portion 58 forming a second planar surface. The second planar surface is spaced apart from the first planar surface a predetermined distance such that the first planar surface is a coupler. At block 810, the target is moved about the shaft axis 13. At block 815, the transmitter coil 16 is excited. At block 820, a plurality of receiver signals is obtained from the sensor assembly 10. At block 825, the target position is obtained based on the straight edge 66 and the first planar surface. At block 830, a corrected sinusoidal input signal is transmitted to the signal processor 702.

It should be appreciated that the embodiments described above incorporated the sensed target coupler element into the geometry of the shaft. Further, it should be appreciated that the coil arrangement is configured to detect the incorporated coupler element based on the geometry of the shaft. Further, while four embodiments having different geometries were described above, the disclosure is not limited to these two geometric shapes and may include further geometric shapes such as, without limitation, a rhombus, a parallelogram, a trapezoid, an octagon, a crescent, and/or the like.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

I claim:

1. An inductive sensor assembly comprising:
   a shaft having a first end;
   a target integrally formed from the first end of the shaft, the target having a first planar surface forming a straight edge, a first undercut portion forming a second planar surface integrally formed into the first end of the shaft, the second planar surface spaced apart from the first planar surface; and
   a sensor assembly having a transmitter coil and a receiving coil,
   wherein when the target is moved about a shaft axis, the straight edge and the first planar surface of the target is detected by the sensor assembly.

2. The inductive sensor assembly of claim 1, wherein the receiving coil of the sensor assembly is a two part receiving coil, the two part receiving coil having a first receiving coil and a second receiving coil.

3. The inductive sensor assembly of claim 2, further comprises:
   a multilayered printed circuit board (PCB),
   wherein the transmitter coil, the first receiving coil and the second receiving coil are on a different layer of the PCB in an axial direction.

4. The inductive sensor assembly of claim 2, wherein the first receiving coil is a first plurality of crescents, each crescent of the first plurality of crescents has a first end and a second end, the first end begins adjacent to a central axis of the of the two part receiving coil and extending radially outward from the central axis of the two part receiving coil.

5. The inductive sensor assembly of claim 4, wherein the second receiving coil is a second plurality of crescents, each crescent of the second plurality of crescents has a first end and a second end, the first end is adjacent to the central axis of the two part receiving coil and extending radially outward from the central axis of the two part receiving coil, the second plurality of crescents being offset in an opposite direction with respect to the first plurality of crescents.

6. The inductive sensor assembly of claim 5, further comprising:
   a signal processor,
   wherein the target integrally formed from the first end of the shaft and the arrangement of the first receiving coil and the second receiving coil corrects a nonsinusoidal input signal to the signal processor.

7. The inductive sensor assembly of claim 2, wherein:
   the target having a second straight edge, a second undercut portion forming a third planar surface integrally formed into the first end of the shaft, the second and third planar surfaces spaced apart from each other and equally spaced apart from the first planar surface.

8. The inductive sensor assembly of claim 7, wherein:
   the first receiving coil is a first plurality of hooks, each hook of the first plurality of hooks has a shank portion and a point portion, the shank portion beginning at an outer periphery of a central axis and tangentially extending radially in a generally radius pattern from the outer periphery of the central axis of the two part receiving coil, the point portion extending radially inward from the transmitter coil towards the central axis of the two part receiving coil.

9. The inductive sensor assembly of claim 8, wherein:
   the second receiving coil is a second plurality of hooks, each hook of the second plurality of hooks has a shank portion and a point portion, the shank portion beginning at the outer periphery of the central axis and tangentially extending radially in a generally radius pattern from the outer periphery of the central axis of the two part receiving coil, the point portion extending radially inward from the transmitter coil towards the central axis of the two part receiving coil, the second plurality of hooks being offset in an opposite direction with respect to the first plurality of hooks.

10. The inductive sensor assembly of claim 2, wherein:
    the target having a second straight edge and a third straight edge, a second undercut portion forming a third planar surface integrally formed into the first end of the shaft and a third undercut portion forming a fourth planar surface integrally formed into the first end of the shaft, the second, third and fourth planar surfaces spaced apart from each other and equally spaced apart from the first planar surface.

11. The inductive sensor assembly of claim 10, wherein:
    the first receiving coil is a first plurality of hooks, each hook of the first plurality of hooks has a shank portion and a point portion, the shank portion beginning at an outer periphery of a central axis and tangentially extending radially in a generally radius pattern from the outer periphery of the central axis of the two part receiving coil, the point portion extending radially inward from the transmitter coil towards the central axis of the two part receiving coil.

12. The inductive sensor assembly of claim 11, wherein:
    the second receiving coil is a second plurality of hooks, each hook of the second plurality of hooks has a shank portion and a point portion, the shank portion beginning at the outer periphery of the central axis and tangentially extending radially in a generally radius pattern from the outer periphery of the central axis of the two part receiving coil, the point portion extending radially inward from the transmitter coil towards the central axis of the two part receiving coil, the second plurality of hooks being offset in an opposite direction with respect to the first plurality of hooks.

13. The inductive sensor assembly of claim 2, wherein:
the target having a second straight edge, a third straight edge and a fourth straight edge, a second undercut portion forming a third planar surface integrally formed into the first end of the shaft, a third undercut portion forming a fourth planar surface integrally formed into the first end of the shaft, and a fourth undercut portion forming a fifth planar surface integrally formed into the first end of the shaft, the second, third, fourth and fifth planar surfaces spaced apart from each other and equally spaced apart from the first planar surface.

14. The inductive sensor assembly of claim 13, wherein:
the first receiving coil is a first plurality of hooks, each hook of the first plurality of hooks has a shank portion and an inverted point portion, the shank portion beginning at an outer periphery of a central axis and tangentially extending radially in a generally radius pattern from the outer periphery of the central axis of the two part receiving coil, the inverted point portion extending radially outward from the transmitter coil away from the central axis of the two part receiving coil.

15. The inductive sensor assembly of claim 14, wherein:
the second receiving coil is a second plurality of hooks, each hook of the second plurality of hooks has a shank portion and an inverted point portion, the shank portion beginning at the outer periphery of the central axis and tangentially extending radially in a generally radius pattern from the outer periphery of the central axis of the two part receiving coil, the inverted point portion extending radially outward from the transmitter coil away from the central axis of the two part receiving coil, the second plurality of hooks being offset in an opposite direction with respect to the first plurality of hooks.

16. An inductive sensor assembly comprising:
a shaft having a first end;
a target integrally formed from the first end of the shaft, the target having a first planar surface forming a straight edge, an undercut portion forming a second planar surface integrally formed into the first end of the shaft, the second planar surface spaced apart from the first planar surface; and
a sensor assembly comprising a printed circuit board (PCB), a transmitter coil and a two part receiving coil, the two part receiving coil comprising:
a first receiving coil and a second receiving coil, the first receiving coil and the second receiving coil are on a different layer of the PCB in an axial direction,
wherein when the target is moved about a shaft axis, the straight edge and the first planar surface of the target is detected by the sensor assembly.

17. The inductive sensor assembly of claim 16 wherein:
the transmitter coil is a two part transmitter coil comprising an upper coil and a lower coil;
the PCB comprises at least four layers in the axial direction, the upper coil positioned on a first layer of the PCB, the lower coil positioned on a second layer of the PCB, the first receiving coil positioned on a third layer of the PCB and the second receiving coil positioned on a fourth layer of the PCB in the axial direction.

18. The inductive sensor assembly of claim 17, wherein the first receiving coil is a first plurality of crescents, each crescent of the first plurality of crescents has a first end and a second end, the first end begins adjacent to a central axis of the of the two part receiving coil and extending radially outward from the central axis of the two part receiving coil.

19. The inductive sensor assembly of claim 18, wherein the second receiving coil is a second plurality of crescents, each crescent of the second plurality of crescents has a first end and a second end, the first end is adjacent to the central axis of the two part receiving coil and extending radially outward from the central axis of the two part receiving coil, the second plurality of crescents being offset in an opposite direction with respect to the first plurality of crescents.

20. A method of determining a position of a movable shaft, the method comprising:
milling a first end of a shaft to form a target, the target having a first planar surface forming a straight edge and an undercut portion forming a second planar surface, the second planar surface spaced apart from the first planar surface a predetermined distance such that the first planar surface is a coupler;
moving the target about a shaft axis;
exciting a transmitter coil;
obtaining a plurality of receiver signals from a sensor assembly;
determining the target positon based on the straight edge and the first planar surface; and
transmitting a corrected sinusoidal input signal to a signal processor.

* * * * *